(12) United States Patent
Stuart

(10) Patent No.: US 11,965,924 B2
(45) Date of Patent: Apr. 23, 2024

(54) ELECTRIC TRANSMISSION LINE GROUND FAULT PREVENTION METHODS USING MULTI-PARAMETER HIGH SENSITIVITY MONITORING

(71) Applicant: Robert B. Stuart, San Tan Valley, AZ (US)

(72) Inventor: Robert B. Stuart, San Tan Valley, AZ (US)

(73) Assignee: Viking Protection Systems LLC, Houston, TX (US)

( * ) Notice: Subject to any disclaimer, the term of this patent is extended or adjusted under 35 U.S.C. 154(b) by 0 days.

(21) Appl. No.: 18/227,670

(22) Filed: Jul. 28, 2023

(65) Prior Publication Data

US 2024/0003955 A1    Jan. 4, 2024

Related U.S. Application Data

(63) Continuation-in-part of application No. 17/693,504, filed on Mar. 14, 2022, now Pat. No. 11,769,998, which is a continuation-in-part of application No. 17/672,422, filed on Feb. 15, 2022.

(51) Int. Cl.
| | | |
|---|---|---|
| *G01R 31/08* | (2020.01) | |
| *G01R 31/52* | (2020.01) | |
| *H02H 1/00* | (2006.01) | |
| *G01R 31/58* | (2020.01) | |
| *H02H 7/26* | (2006.01) | |

(52) U.S. Cl.
CPC ......... *G01R 31/086* (2013.01); *G01R 31/088* (2013.01); *G01R 31/52* (2020.01); *H02H 1/0007* (2013.01); *G01R 31/58* (2020.01); *H02H 7/26* (2013.01)

(58) Field of Classification Search
CPC .... G01R 31/086; G01R 31/088; G01R 31/52; G01R 31/58; H02H 1/0007; H02H 7/26
USPC .......................................................... 361/47
See application file for complete search history.

(56) References Cited

U.S. PATENT DOCUMENTS

| | | | |
|---|---|---|---|
| 10,197,614 B2 * | 2/2019 | Benmouyal .......... | G01R 31/085 |
| 10,823,777 B2 * | 11/2020 | Dase .................... | G01R 19/165 |
| 10,955,455 B2 * | 3/2021 | Thompson ............... | H02H 5/10 |

(Continued)

*Primary Examiner* — Yemane Mehari
(74) *Attorney, Agent, or Firm* — Wilkinson Law Office; Clinton H. Wilkinson

(57) ABSTRACT

A method for preventing ground fault in a three-phase electric transmission line system caused by a line break, includes: providing a programmable relay protection system, including a plurality of relay devices on each line, programmed to include: monitoring of acceptable preset parameter ranges of at least three pairs electric operating conditions, that include at least one high sensitivity instantaneous undercurrent and at least one high sensitivity condition selected from line differential overcurrent and negative sequence instantaneous overcurrent, zero sequence instantaneous overcurrent, and change in instantaneous undercurrent (and combinations thereof); permitting closed circuit operation when all of the lines show that the operating conditions are within the preset acceptable ranges; tripping a circuit breaker on a broken line when that line shows two operating conditions outside the preset parameter ranges; and shutting down power to the broken line before it otherwise causes a ground fault or other short circuit.

20 Claims, 14 Drawing Sheets

(56) References Cited

U.S. PATENT DOCUMENTS

| | | | |
|---|---|---|---|
| 11,211,788 B2* | 12/2021 | Wade | H02H 7/263 |
| 2019/0109451 A1* | 4/2019 | Takemura | H02H 3/044 |
| 2019/0317143 A1* | 10/2019 | Dase | H02H 3/38 |
| 2021/0091559 A1* | 3/2021 | Mobley | H02H 7/26 |

* cited by examiner

Example 1 Prior Art System- 500 KiloVolts, 1500 Amps

Example 2 Present invention System- 500 KiloVolts, 1500 Amps

Example 3 Prior Art System- 115 KiloVolts, 100 Amps

Example 4 Present Invention System- 115 KiloVolts, 100 Amps

ELECTRIC TRANSMISSION LINE GROUND FAULT PREVENTION METHODS USING MULTI-PARAMETER HIGH SENSITIVITY MONITORING

RELATED PATENT APPLICATIONS

This application is a continuation in part of co-pending United States Patent applications, as follows: U.S. Utility patent application Ser. No. 17/672,422, titled "Electric Transmission Line Ground Fault Prevention Methods Using Dual, High Sensitivity Monitoring", filed on 15 Feb. 2022, with common inventorship herein and is also a continuation-in-part of co-pending U.S. Utility patent application Ser. No. 17/693,504, titled "Electric Transmission Line Ground Fault Prevention Systems Using Dual, High Sensitivity Monitoring Devices", filed on Mar. 14, 2022, with common inventorship herein.

BACKGROUND OF INVENTION a. Field of Invention

High voltage (sometimes referred to as high tension) and other three phase electric transmission systems are prone to failing lines that cause ground faults or other short circuits. Typically, such failures result from breaks in an individual line, connection breaks, object intersection, aging, adverse weather, support structure failure, etc. For example, transmission lines that were built decades ago have aged to the point where conductors (lines) separate from splices, or otherwise break and open with double jumpers and double dead end (DDE) towers. These double jumpers may slap against the steel towers or otherwise ground to cause fires and/or injury to structures, persons, animals and wildlife and flora. In the case of two major 2018 California fires, many homes and entire towns were destroyed by fire caused by ground faults resulting from broken lines.

Historically, the industry has focused attention to preservation of transmission lines, transformers, generators and substations by monitoring systems for shorts and ground faults, reacting according to the concept of best methods for preserving equipment and maintaining best (least interrupted) services to the load (consumers). Thus, for decades and presently, the industry utilizes preprogrammed relays that monitor operating conditions to identify shorts and to shut down electricity on the shorted line and isolate to provide electricity to the consumer. These relays react once a ground fault or other short has occurred. The present invention is directed to a very different approach—the use of methods, devices and systems that focus on identifying a break in a line before a short or ground fault occurs, thereby preventing disasters that may result from such shorts and ground faults. There are about 1.3 to 1.7 seconds between the time a line breaks and the time a short occurs (i.e., the time it takes to touch a foreign conductor, such as ground, tower or building). The present invention is directed to unique approaches to see the break in real time within fractions of a second, even milliseconds, and to likewise shut down the line (trip the breaker(s)) within fractions of a second and, hence, before any short occurs, avoid many possible disasters. This is achieved by micro-monitoring, looking at different parameters (operating conditions) from those used in the prior art relays, and reacting nearly instantaneously.

b. Description of Related Art

The following patents are representative of the field pertaining to the present invention:

U.S. Pat. No. 6,518,767 to Roberts et al. describes a power line current differential protection system. All three phase current values ($I_{.sub.A}$, $I_{.sub.B}$ and $I_{.sub.C}$) are obtained from both the local end and the remote end of a power transmission line. The magnitude of the ratio of the remote current values to the local current values are calculated. Also, the angle difference between the local and the remote current values for each phase are calculated. Comparison elements then compare the ratio and angle values against preselected values which establish a restrain region in the current ratio plane. Current values which result in the ratio being within the region do not result in a tripping signal for the circuit breaker on the power transmission line, while current values which result in a ratio outside of the region result in a tripping of the circuit breaker. Similar circuitry is used for negative sequence current quantities, with the negative sequence preselected values being set substantially lower to produce a more sensitive response to possible faults in the line.

U.S. Pat. No. 10,197,614 to Benmouyal et al. illustrates the errors that are encountered when using both single-ended and double-ended normal-mode fault location calculations when a fault occurs in a pole-open condition. The disclosure provides systems and methods for accurately calculating the location of faults that occur during pole-open conditions, including single-ended approaches and double-ended approaches.

U.S. Pat. No. 10,340,684 to Sridharan et al. describes how a location of a broken electrical conductor of an electric power delivery system may be detected by monitoring a rate of change of phase voltage and/or a rate of change of zero-sequence voltage at various points on the conductor. Intelligent electronic devices (IEDs) such as phasor measurement units may be used to obtain measurements and calculate synchrophasors. The synchrophasors may be used by a central controller to determine which two continuous IEDs measure rates of change of voltages of opposite polarities, where the broken conductor is between the two continuous IEDs. The synchrophasors may be used by a central controller to determine which two continuous IEDs where one exhibits a zero-sequence voltage magnitude that exceeds a predetermined threshold for a predetermined time, wherein the zero-sequence voltage magnitude of the other of the continuous IEDs does not exceed the predetermined threshold.

U.S. Pat. No. 10,823,777 to Dase et al. relates to detecting a broken conductor in a power transmission line. In an embodiment, a processor receives a signal indicating current on the transmission line. The processor determines that a broken conductor is present on the transmission line based at least in part on a magnitude of the current being less than a line charging current of the transmission line and a phase angle of the current leading a respective phase voltage of the transmission line. The processor effects a control operation based on the determined broken conductor.

U.S. Pat. No. 10,955,455 to Thompson et al. pertains to detection of a broken conductor in an electric power system. In one embodiment, a broken conductor detector may be configured to be mounted to an electrical conductor and may comprise a communication subsystem configured to transmit a signal configured to indicate that the conductor is broken. A sensor may determine an operating vector. A processing subsystem may be configured to receive the operating vector from the sensor and to identify when the operating vector is outside of a range defined by a rest vector and a threshold value. In certain embodiments, the threshold may comprise a three-dimensional sphere. The processing subsystem may determine that the conductor is broken based on the operating vector remaining outside of the range for a period of time determined by the timer subsystem. A signal may be transmitted by the communication subsystem to indicate that the conductor is broken.

U.S. Pat. No. 11,211,788 to Wade et al. describes how systems and methods may mitigate risk of fire caused by an electric power system. In one embodiment, a system may include an intelligent electronic device (IED). The IED includes a communication subsystem to receive a signal from a sensor related to a condition of the electric conductor. A processing subsystem in communication with the communication subsystem may operate in at least two modes comprising a high security mode and a fire prevention mode. In the fire prevention mode, the IED may interrupt a flow of electric current based on the signal from the at least one sensor associated with the electric conductor. In the high security mode, the system may interrupt a flow of electric current based on the signal from the at least one sensor associated with the electric conductor and based on a second condition relating to the electric conductor.

U.S. Publication No. 20190317143 to Gangadhar et al. relates to detecting a broken conductor in a power transmission line. In an embodiment, a processor receives a signal indicating current on the transmission line. The processor determines that a broken conductor is present on the transmission line based at least in part on a magnitude of the current being less than a line charging current of the transmission line and a phase angle of the current leading a respective phase voltage of the transmission line. The processor effects a control operation based on the determined broken conductor.

U.S. Publication No. 20190324074 to Thompson et al. pertains to detection of a broken conductor in an electric power system. In one embodiment, a broken conductor detector may be configured to be mounted to an electrical conductor and may comprise a communication subsystem configured to transmit a signal configured to indicate that the conductor is broken. A sensor may determine an operating vector. A processing subsystem may be configured to receive the operating vector from the sensor and to identify when the operating vector is outside of a range defined by a rest vector and a threshold value. In certain embodiments, the threshold may comprise a three-dimensional sphere. The processing subsystem may determine that the conductor is broken based on the operating vector remaining outside of the range for a period of time determined by the timer subsystem. A signal may be transmitted by the communication subsystem to indicate that the conductor is broken.

U.S. Publication No. 20210048486 to Bell et al. describes systems for determining a broken conductor condition in a multiple-phase electric power delivery system. It has been observed that broken conductors pose a safety concern when occurring in the presence of people or vulnerable environmental conditions. Broken conductor conditions disclosed herein may be used to detect and trip the phase with the broken conductor, thus reducing or even eliminating the safety risk. Further, a distance to the opening may be determined.

U.S. Publication No. 20210091559 to Mobley et al. pertains to detection of a broken conductor in an electric power system. In one embodiment, a broken conductor detector may be configured to be mounted to an electrical conductor and may comprise a communication subsystem configured to transmit a signal configured to indicate that the conductor is broken. A sensor may determine a plurality of vectors. A processing subsystem may be configured to receive the plurality of vectors from the sensor and to identify when the vector is outside of a range defined by a threshold value. The processing subsystem may determine that the conductor is falling based on the plurality of vectors remaining outside of the threshold for a period of time determined by the timer subsystem. A signal may be transmitted by the communication subsystem to indicate that the conductor is falling.

U.S. Publication No. 20210265834 to Wade et al. describes how systems and methods may mitigate risk of fire caused by an electric power system. In one embodiment, a system may include an intelligent electronic device (IED). The IED includes a communication subsystem to receive a signal from a sensor related to a condition of the electric conductor. A processing subsystem in communication with the communication subsystem may operate in at least two modes comprising a high security mode and a fire prevention mode. In the fire prevention mode, the IED may interrupt a flow of electric current based on the signal from the at least one sensor associated with the electric conductor. In the high security mode, the system may interrupt a flow of electric current based on the signal from the at least one sensor associated with the electric conductor and based on a second condition relating to the electric conductor.

Published article 2016 IEEE "Catching Falling Conductors in Midair—Detecting and Tripping Broken Distribution Circuit Conductors at Protection Speeds" by William O'Brien, Eric power distribution circuit conductor breaks—for example, when a car strikes a pole or a splice or clamp fails—the energized conductor falls to ground. The resulting high-impedance ground fault may be difficult or impossible to detect by relays located in the substation. In any case, no ground fault protection relay can operate until well after the time the fault has occurred—after the falling energized conductor has hit the ground and created a hazardous situation. For decades, utilities and equipment manufacturers have worked to develop methods for tripping these hazardous ground faults as quickly as possible. This paper describes a new falling conductor detection scheme that trips the affected circuit section in the narrow time window between the moment of the break and the time the conductor hits the ground. The affected circuit section is de-energized while the conductor is still falling, eliminating the risk of an arcing ground fault or energized circuits on the ground.

Published article 2019 Schweitzer Engineering Laboratories, Inc. "Detecting and Locating Broken Conductor Faults on High-Voltage Lines to Prevent Autoreclosing Onto Permanent Faults" by Kanchanrao Dase, Sajal Harmukh, and Arunabha Chatterjee describes how broken-conductor detection is challenging because the conductor may remain suspended without causing any fault current. Even if the conductor falls to the ground, the fault current might remain low, depending on the fault resistance. For low-resistance faults, a relay can detect faults and trip the line breakers. However, because the relay cannot determine whether the fault is permanent, it may attempt to reclose, causing further stress to the power system. This paper describes a new algorithm that uses only single-ended measurements to reliably detect broken conductors and estimate their location by using the charging current of the line. The phase angle of this current leads the voltage by about $\angle 90°$, and the magnitude is a function of line length. This method is suitable for power lines that have measurable charging current, and it detects broken conductors successfully if the relay can measure the charging current while the conductor is falling in midair. Broken-conductor detection can be used to trip the breakers before the conductor touches the ground and creates a shunt fault. Thus, the algorithm can prevent such faults and block any attempt to reclose the line. Detecting broken conductors and their location information provided by the algorithm can help in quickly resolving broken-conductor faults. This paper presents three field events from 57.1 kV and 220 kV lines and results from Electromagnetic Transients Program (EMTP) simulations that validate the algorithm.

U.S. Pat. No. 9,753,096 to Kim and related U.S. Pat. No. 8,866,626 to Kim both describe a method, system and computer software for detecting an incipient failure of a generator in a power system including the steps of ascertaining one or more generator reference parameter of the generator for use as a baseline reference; measuring one or more operating parameter values of the generator; using the one or more operating parameter values to solve for an estimated present value of the one or more of the generator's current performance parameters using particle swarm optimization technique; and determining whether the estimated present values of the one or more of the generator's current performance parameters are outside of an acceptable limit.

U.S. Pat. No. 7,345,456 to Gibbs et al. describes a stabilizer and synchronous electric power generator system using same that provides both power system damping and excitation limiter functionality. The stabilizer includes a processing unit and a memory storing routines executable by the processing unit. The routines are adapted to receive a voltage signal indicative of a voltage and a current signal indicative of a current output by the generator system, generate, utilizing the voltage and current signals, a power system stabilizer signal for damping oscillations and one or more excitation limiter function signals for controlling excitation level. The routines are also adapted to generate a feedback signal for the generator system by combining the power system stabilizer signal and one or more of the one or more excitation limiter function signals.

U.S. Pat. No. 5,761,073 to Dickson describes a programmable autosynchronizer for use with a system having generator and bus voltages and having a breaker circuit for connecting the generator and bus voltages to each other. The autosynchronizer synchronizes the frequency and phase of the generator and bus AC voltages by controlling the generator voltage. A microprocessor compares the frequencies of generator and bus voltage signals, the microprocessor generating a proportional difference signal having a parameter representative of a proportional difference in frequency between the generator and bus voltage signals. The proportional correction range extends within the synchronization range. The microprocessor permits a sync signal when the frequency difference of the frequencies of the generator and bus voltage signals is within the synchronization frequency range. A first output circuit responsive to the proportional difference signal provides a correction signal to the generator for varying the frequency of the generator. A second output circuit responsive to the sync signal provides a breaker close signal to the breaker circuit for closing the breaker thereby enabling connection of the generator and bus voltages. A frequency correction dead band within the frequency range and a target slip band within the dead band define a zone of limited proportional correction to nudge the generator into synchronization and prevent a hung scope.

U.S. Pat. No. 5,751,532 to Kanuchok, et al. describes a relay for monitoring an electrical system to protect the electrical system from an overcurrent condition as a time dependent function of an electrical current level in the electrical system is disclosed. The relay includes a memory which stores a current level count and a current level detector coupled to the electrical system which detects the electrical current level in the electrical system over time. A microprocessor responds to the current level detector by varying the current level count in the memory as a function of the electrical current level over time. The microprocessor also detects an occurrence of the electrical current level falling below a minimum current level. A timer responds to the microprocessor by measuring a period of time during which the electrical current level is less than the minimum current level. The microprocessor responds to the timer by varying the current level count in the memory as a function of the measured period of time during which the electrical current level is below the minimum current level. A method of monitoring an electrical system to protect the electrical system from an overcurrent condition as a time dependent function of an electrical current level in the electrical system is also disclosed. Other apparatus and methods are also disclosed.

U.S. Pat. No. 5,640,060 to Dickson describes an autosynchronizer for use with a system having generator and bus voltages and having a breaker circuit for connecting the generator and bus voltages to each other. The autosynchronizer synchronizes the frequency and phase of the generator and bus AC voltages by controlling the generator voltage. A microprocessor compares the frequencies of generator and bus voltage signals, the microprocessor generating a proportional difference signal having a parameter representative of a proportional difference in frequency between the generator and bus voltage signals. The proportional correction range extends within the synchronization range. The microprocessor permits a sync signal when the frequency difference of the frequencies of the generator and bus voltage signals is within the synchronization frequency range. A first output circuit responsive to the proportional difference signal provides a correction signal to the generator for varying the frequency of the generator. A second output circuit responsive to the sync signal provides a breaker close signal to the breaker circuit for closing the breaker thereby enabling connection of the generator and bus voltages. A frequency correction dead band within the frequency range and a target slip band within the dead band define a zone of limited proportional correction to nudge the generator into synchronization and prevent a hung scope.

U.S. Pat. No. 5,309,312 to Wilkerson, et al. describes an apparatus for protecting an electrical power system supplying electrical power to an electrical load comprises a transformer for sensing an operating condition of the electrical power system and for producing an analog signal representative of the operating condition, and a microcomputer for periodically sampling the analog signal and for converting the analog signal into a series of digital signals. The microcomputer includes circuitry for deriving a digital value representative of a square root of the series of digital signals and circuitry for processing the digital value over time to determine a processed value which is a function of both the sensed operating condition and time. A circuit breaker is responsive to the microcomputer for disconnecting the power system from the load in the event that the processed value is not within preset limits. The microcomputer also generates a relay signal representative of the status of the relay and the relay includes an output port responsive to the relay signal, for communicating the status of the relay to a remote station.

U.S. Pat. No. 5,014,153 to Wilkerson describes an apparatus for monitoring phased currents in a first winding and a second winding of a transformer and for disconnecting the transformer from a power source supplying the transformer when a difference between the magnitude of the current in the first winding and the magnitude of the current in the second winding exceeds a predetermined amount to indicate a fault condition is disclosed. The apparatus is used in combination with circuitry for generating first and second current signals each having a phase and magnitude which is a function of the phase and magnitude of the phased currents in the first and second windings, respectively. The apparatus includes a circuit for shifting the phase of the second current signal to match the phase of the first current signal, a circuit for detecting a difference between the magnitude of the first current signal and the magnitude of the phase shifted second current signal, and a circuit for disconnecting the transformer from the power source when the detected difference exceeds the predetermined amount.

U.S. Pat. No. 4,788,619 to Ott, et al. describes a protective relay for use in an electrical power system having electrical conductors which are energized with an AC voltage. The protective relay includes a circuit for sensing the AC voltage to produce an AC output that has zero crossings and a time period between zero crossings, a circuit for supplying an electrical signal representing a preselected pickup value of volts-per-Hertz for the relay, and a circuit responsive to the AC output and to the electrical signal for generating an electrical level as a function of both the time period and the pickup value and for producing an output signal for the relay when the AC output exceeds the electrical level. In this way, the output signal is produced when a volts-per-Hertz value of the AC voltage exceeds the preselected pickup value of volts-per-Hertz for the relay. Other protective relay apparatus and methods are also disclosed.

U.S. Pat. No. 4,757,416 to Wilkerson describes a protective apparatus for use in an A.C. electrical power system with a circuit breaker for connecting and disconnecting first and second electrical conductors that are electrically energized, the conductors normally having a negligible phase difference of electrical energization when the circuit breaker is closed, and the circuit breaker having auxiliary contacts defining the state of the circuit breaker as open or closed. The protective apparatus includes a circuit responsive to the auxiliary contacts for producing a first signal representative of the state of the breaker as open or closed and another circuit connected to the circuit for producing the first signal and operable when the breaker is closed for generating a second signal when the phase difference of electrical energization of the first and second electrical conductors exceeds a predetermined value. A further circuit provides an indication of malfunction of the circuit breaker when the second signal occurs. Phase window extending apparatus for use in the protective apparatus, methods of operation and other protective apparatus are also disclosed.

Notwithstanding the prior art, the present invention is neither taught nor rendered obvious thereby.

SUMMARY OF INVENTION

The present invention relates to a method for preventing ground fault or other short circuit in a three-phase electric transmission line system having at least three lines (phases), caused by a break in a line. The method includes providing a programmable relay protection system, including a plurality of communicating relay devices on each line of the electric transmission line system. These relay devices may be newly created or existing but are programmed differently from existing protection relays. (To aid in reading this document, the words "and" and "or" when presented in lower case form, are intended to have the conventional meanings of those words; the words "AND" and "OR" when presented in upper case form, are intended to mean logic decisions, such as in logic GATES. When an AND GATE is used, two or more sets of data or information or conditions must all meet the criteria for a YES or positive signal to pass. When an OR GATE is used with two or more sets of data or information or conditions, only one set must meet the criteria for a YES or positive signal to pass.

Thus, the present invention relay protection system is programmed to include: a) preset acceptable parameter ranges of multiple pairs of high sensitivity electric operating conditions, one of which is instantaneous undercurrent or change in instantaneous undercurrent, and the other of which is selected from the group consisting of (i) line differential overcurrent; (ii) negative sequence instantaneous overcurrent; (iii) neutral line differential overcurrent; (iv) zero sequence instantaneous overcurrent and (v) combinations thereof; b) monitoring means to monitor each line at each of the plurality of relay devices for the at least one operating condition; c) permitting closed circuit operation when all of the lines show the at least two operating conditions are within the preset acceptable operating parameter ranges; d) a tripping mechanism to trip a circuit breaker on a broken line when that line shows the at least one operating condition is outside the preset parameter ranges. In some embodiments, the monitoring of each line at each of the plurality of relay devices for the operating conditions are programmed to be highly sensitive so as to monitor and measure instantaneous undercurrent in the range of 0.01 to 0.5 amp, so as to monitor and measure line different overcurrent in the range of 0.01 to 0.5 amp, so as to monitor and measure negative sequence overcurrent in the range of 0.01 to 0.5 amp, as to monitor and measure neutral line differential overcurrent in the range of 0.01 to 0.5 amp, so as to monitor and measure zero sequence overcurrent in the range of 0.01 to 0.5 amp, so as to monitor and measure.

In some embodiments of the present invention, the plurality of relay devices on each line is programmed to monitor both upstream and downstream from each of said plurality of relay devices such that when a line is broken, the monitored operating conditions of both ends of the break are recognized and reported in the system to effect said shutting down power to said broken line by tripping two circuit breakers, one being upstream from the break and the other being downstream from the break.

In some embodiments of the present invention method for preventing ground fault or other short circuit in a three-phase electric transmission line system, the programmable relay protection system plurality of relay devices are programmed to monitor line instantaneous undercurrent, and to monitor sensitive zero sequence instantaneous overcurrent. In some embodiments of the present invention method, the programmable relay protection system plurality of relay devices are programmed to monitor line instantaneous undercurrent, and to monitor neutral line differential overcurrent. In some embodiments of the present invention method, the programmable relay protection system plurality of relay devices are programmed to monitor changes in line instantaneous undercurrent, and to monitor zero sequence instantaneous overcurrent.

In some embodiments of the present invention method, the plurality of relay devices are programmed to monitor instantaneous undercurrent, and a second operating condition of said operating conditions being selected from the group consisting of a) line differential overcurrent; b) negative sequence instantaneous overcurrent; and to further monitor line instantaneous undercurrent in combination with zero sequence instantaneous overcurrent. In some embodiments of the present invention method, the plurality of relay devices are programmed to monitor instantaneous undercurrent, and a second operating condition of said operating conditions being selected from the group consisting of a) line differential overcurrent; b) negative sequence instantaneous overcurrent; and to further monitor line instantaneous undercurrent in combination with neutral line differential overcurrent. In some embodiments of the present invention method, the plurality of relay devices are programmed to monitor instantaneous undercurrent, and a second operating condition of said operating conditions being selected from the group consisting of a) line differential overcurrent; b) negative sequence instantaneous overcurrent; and to further monitor changes in line instantaneous undercurrent in combination with zero sequence instantaneous overcurrent.

In some embodiments of the present invention method, the plurality of relay devices are programmed to be highly sensitive so as to monitor and measure differential overcurrent in the range of 0.01 to 0.5 amp, and so as to monitor and measure instantaneous undercurrent in the range of 0.1 to 1 amp. In some embodiments of the present invention method, the plurality of relay devices are programmed to be highly sensitive so as to monitor and measure differential overcurrent in the range of 0.01 to 0.5 amp, and so as to monitor and measure instantaneous undercurrent in the range of 0.01 to 0.05 amp. In some embodiments of the present invention method, the plurality of relay devices are programmed to be highly sensitive so as to monitor and measure negative sequence instantaneous overcurrent in the range of 0.01 to 0.5 amp, and so as to monitor and measure instantaneous undercurrent in the range of 0.01 to 0.5 amp.

In some embodiments of the present invention method, the relay protection system includes sufficient software and hardware for recognizing line breakage capacitive current within 0.5 seconds when said at least one operating condition falls outside of said preset parameter ranges, and communicating to open the circuit breaker on said broken line within 10 milliseconds, thereby shutting down power to said broken line before it otherwise causes a ground fault or other short circuit. In some embodiments of the present invention method, the relay protection system includes a plurality of relay devices having phasors for monitoring all three phase voltages and currents and phase angle similarities and differences to detect capacitive current and deviations from preset ranges thereof.

In some embodiments of the present invention method, there are at least two AND gates and at least one OR gate for processing monitored data readings and tripping breakers, including a first AND gate that receives line differential overcurrent readings and instantaneous undercurrent readings, and includes a second AND gate that receives negative sequence instantaneous overcurrent readings and second instantaneous undercurrent readings. In some embodiments of the present invention method.

In some embodiments of the present invention method, there are at least two AND gates and at least one OR gate for processing monitored data readings and tripping breakers, including a first and gate that receives line differential overcurrent readings and one of instantaneous undercurrent readings and negative sequence instantaneous overcurrent, and includes a second AND gate that receives zero sequence instantaneous overcurrent readings and instantaneous under current readings.

In some embodiments of the present invention method, there are at least two AND gates and at least one OR gate for processing monitored data readings and tripping breakers, including a first AND gate that receives line differential overcurrent readings and one of instantaneous undercurrent readings and negative sequence instantaneous overcurrent, and includes a second AND gate that receives neutral line differential overcurrent readings and instantaneous undercurrent readings.

In some embodiments of the present invention method, there are at least two AND gates and at least one OR gate for processing monitored data readings and tripping breakers, including a first AND gate that receives line differential overcurrent readings and one of instantaneous undercurrent readings and negative sequence instantaneous overcurrent, and includes a second AND gate that receives zero sequence instantaneous overcurrent readings and change in instantaneous undercurrent readings.

In some embodiments of the present invention method, there are at least three AND gates and at least one OR gate for processing monitored data readings and tripping breakers, including a first AND gate that receives line instantaneous undercurrent readings and negative sequence instantaneous overcurrent readings, and including a second AND gate that receives zero sequence instantaneous overcurrent readings and instantaneous undercurrent readings, and including a third AND gate that receives neutral line differential overcurrent readings and instantaneous undercurrent readings.

In some embodiments of the present invention method, there are at least three AND gates and at least one OR gate for processing monitored data readings and tripping breakers, including a first AND gate that receives line instantaneous undercurrent readings and negative sequence instantaneous overcurrent readings, and includes a second AND gate that receives neutral line differential overcurrent readings and instantaneous undercurrent readings and a third AND gate that receives zero sequence instantaneous overcurrent readings and change in instantaneous undercurrent readings.

In some embodiments of the present invention method, there are at least five AND gates and at least one OR gate for processing monitored data readings and tripping breakers, including a first AND gate that receives line differential overcurrent readings and instantaneous undercurrent readings, and including a second AND gate that receives instantaneous undercurrent readings and negative sequence instantaneous overcurrent readings, and includes a third AND gate that receives neutral line differential overcurrent readings and instantaneous undercurrent readings and a fourth AND gate that receives zero sequence instantaneous overcurrent readings and instantaneous undercurrent readings and a fifth AND gate that receives zero sequence instantaneous overcurrent readings and change in instantaneous undercurrent readings.

The preferred concept is to program the relays to sense the aforementioned condition deviations from the preset parameter ranges, that occur at both broken ends of a broken line, and shut down the power to the broken line, and to do these functions on an extremely rapid basis, preferably under 1.0 second, and most preferably under 50 milliseconds. That is, to complete the monitoring, recognize the break's two changes in these monitored conditions sensed to be outside the operating ranges, communicate with breaker(s), and shut down the power, all before the broken line touches a tower, pole or ground. In some preferred embodiments, the present invention method includes sensing open conductor broken line within 0.5 second of the break, and communicating to open the circuit breaker on the broken line to shut down within another 0.5 seconds, thereby shutting down power to the broken line before it otherwise causes a ground fault or other short circuit, i.e., before one or both ends at the break of a broken line touches a tower, pole or ground.

Additional features, advantages, and embodiments of the invention may be set forth or apparent from consideration of the following detailed description, drawings, and claims. Moreover, it is to be understood that both the foregoing summary of the invention and the following detailed description are exemplary and intended to provide further explanation without limiting the scope of the invention as claimed.

BRIEF DESCRIPTION OF THE DRAWINGS

The accompanying drawings, which are included to provide a further understanding of the invention and are incorporated in and constitute a part of this specification, illustrate preferred embodiments of the invention and together with the detail description serve to explain the principles of the invention. In the drawings.

DETAILED DESCRIPTION OF THE INVENTION

Figure 1:
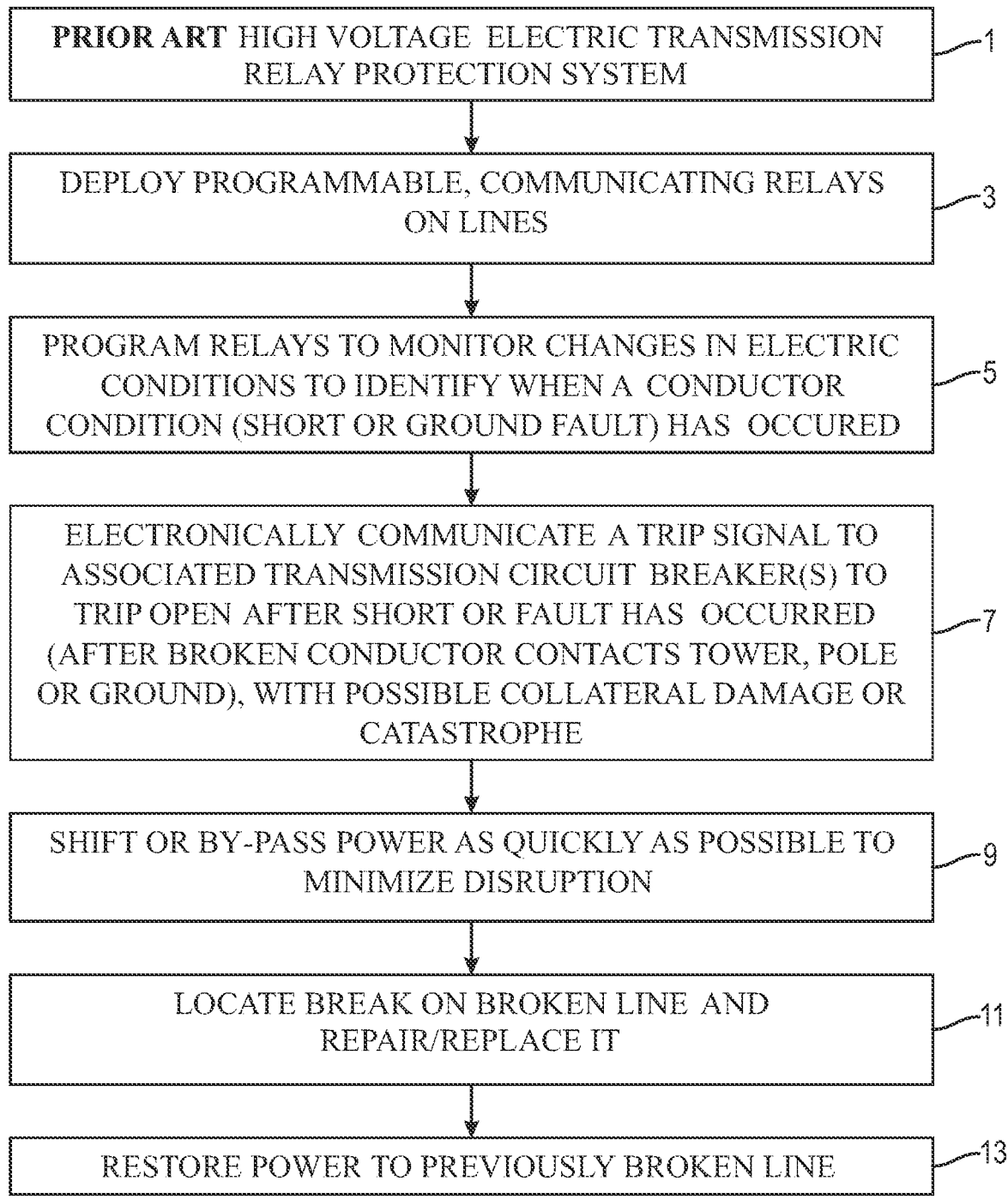
FIG. 1 is a block diagram showing some of the features of a Prior Art high voltage electric transmission relay protection system.

Electricity begins with production of power, i.e., the source, in the form of any electric-producing-facility, fossil fuel power plant, hydroelectric, wind farm, solar form, hybrid, co-generation, etc. When electricity is produced, it is next distributed and then consumed. The four major aspects are production, transmission, distribution and consumption. Transmission usually begins with high voltage (sometimes called high tension) lines transmitting from the source, through the lines, to the load. Distribution involves step-down substations with transformers and other components to regulate electric flow. It is well known that resistance will cause huge drops in delivered electricity to the load, and it is well known that the negative effect of resistance along the lines (wires) can be significantly reduced by lowering the current and increasing the voltage. As an example, a 110 volt line could lose over 70% of its value before reaching a load, depending upon line material and distance, whereas high voltage lines operating at very high voltages, such as 345 kilovolts, might lose only 0.5% of its value to the load over many miles. Large amounts of power can only be transmitted over long distances by very high and extremely high voltage transmission lines from a practical standpoint, otherwise resistive losses of energy are prohibitive.

For decades (at least 50 years), high voltage transmission systems have grown into significant sizes that are interconnected into what is called a grid, e.g., the North America grid. The grid is a mixture of different transmission voltages that is utilized because it is often used to share production resources in one region, taking power from one region and sending it to another region. One significant disadvantage is that a downed line or lines, on one segment or region of a grid, may cause other operating segments or regions to overload and shut down. Hence, the domino theory (one falls down and others follow sequentially) has applied to grids around the world, causing hundreds of thousands or even millions of consumers to lose power for significant periods of time.

To countermand these happenstances, grid reconfigurations, new equipment, new software, added redundancies and other support features have been added to the grid. In addition, line monitoring for short circuits, including ground faults, and shutting down circuits in response, is an integral part of high voltage ("HV") transmission systems, also known as high voltage transmission systems.

Thus, for decades, programmable relays have been used to identify and respond to short circuits. The term "ground fault" as used herein, is meant to reference a disruption caused by a live wire or other live electric component unintentionally contacting a conductor, such as a conductive structure, the ground, a body of water, etc. The term "broken line" as used herein shall be taken broadly to include live wires, live connectors, live splices and splice components that have experienced a break in the circuitry with a short or fault that has or is about to occur.

Referring now in detail to the drawings wherein like reference numerals designate corresponding parts throughout the several views, various embodiments of the present invention are shown.

The standard in the industry is to monitor the transmission system to recognize a ground fault and to react to it. The conventional steps of the PRIOR ART are shown in FIG. 1, block 1 (Prior Art High Voltage Electric Transmission Relay Protection Systems) are:
- (1) deploy programmable, communicating relays along transmission lines, block 3;
- (2) program these relays to monitor macro changes in electric conditions along the lines to identify when a ground fault has occurred, block 5;

(3) communicate to the appropriate breaker to shut down the breaker after the ground fault has occurred with possible collateral damage and possible catastrophic damage, block 7;

(4) shift power as quickly as possible to by-pass (isolate) the broken line to other transmission lines to minimize disruption, block 9 (this occurs with existing equipment and grid configurations as the transmission system reconfigures);

(5) locate the broken line and repair/replace it, block 11, and;

(6) restore power to the previously broken line, block 13.

This prior art procedure seems to be used frequently, if not universally, but has the disadvantage of collateral damage, from minor property, livestock or flora and fauna damage, to significant collateral damage-fires, destruction and the like, to catastrophic collateral damage-loss life or many lives, destruction of valuable property, such as in the millions or even hundreds of millions of dollars, and even destruction of entire communities.

The present invention is directed to the elimination of all collateral and catastrophic damage caused by a short or ground fault. This is achieved by utilizing micro monitoring programming in the relays to not look at ground faults, but to micro monitor small changes in capacitive current and capacitive voltage that occurs after a line is broken and before it shorts or grounds (that is, before it touches a tower, pole, ground or other grounding object). "Micro" as used herein does not mean one millionth or other exact measurement, but rather is intended to connote very small measurements on a relative basis. In this context, the present invention measurements are at least an order of magnitude smaller than present commercial relays measurements that occur upon a short or ground fault. For lower range high voltage systems, the present invention methods are monitoring conditions that are two or even three orders of magnitude smaller. Further, in the present invention methods, timing is critical and the conditions measured are different and critical. This unique approach enables breakers to be shut down (and hence cease electric flow) before any collateral damage could otherwise occur.

Figure 2A:
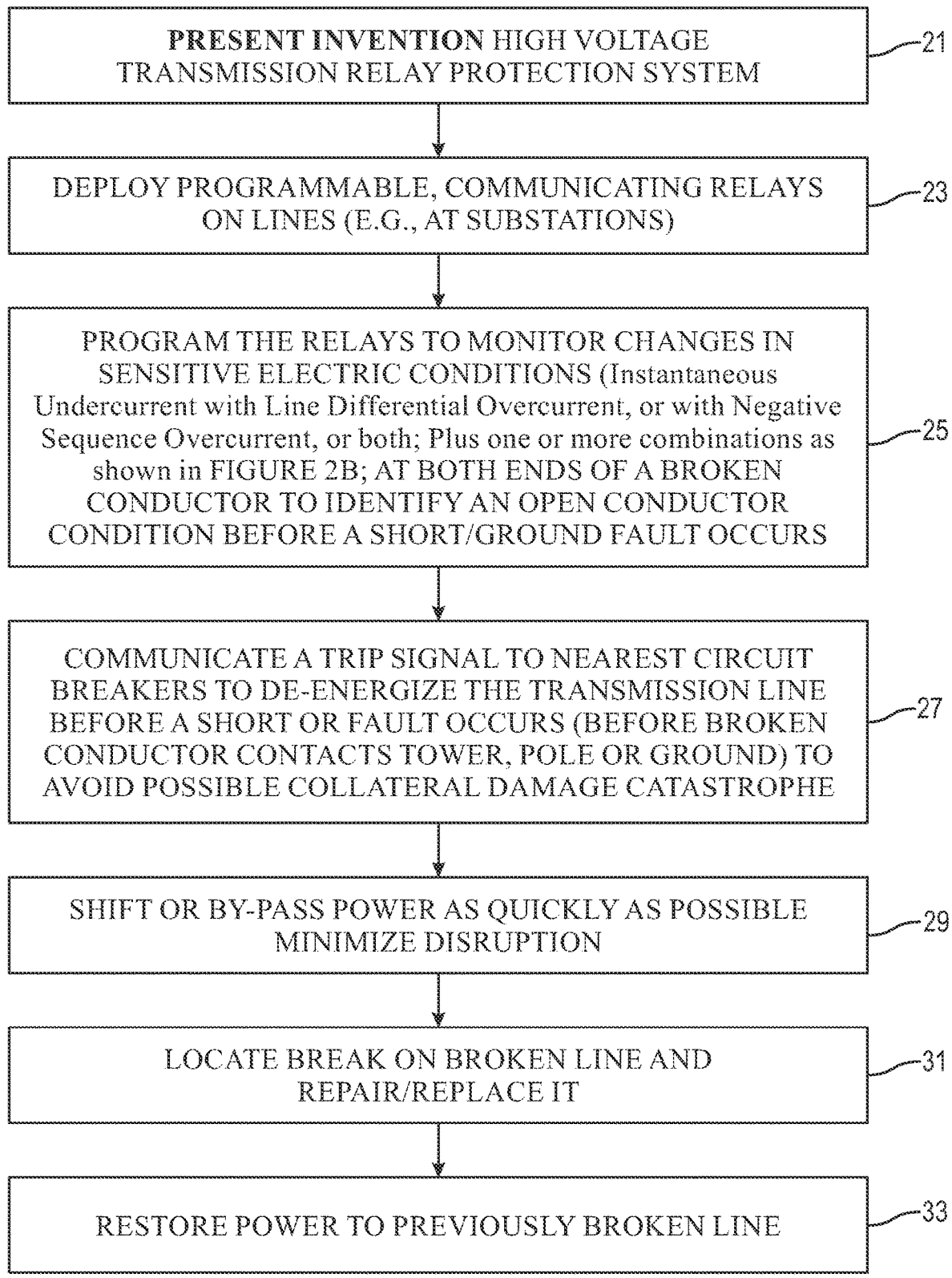
FIGS. 2A and 2B are related block diagrams showing some of the features of a Present Invention high voltage electric transmission relay protection system that relies upon micro monitoring of highly sensitive line conditions— namely, one of which is instantaneous undercurrent, and the other of which is selected from (i) line differential overcurrent, (ii) negative sequence instantaneous overcurrent, (iii) neutral line differential overcurrent, (iv) zero sequence instantaneous overcurrent and (v) combinations thereof.
Figure 2B:
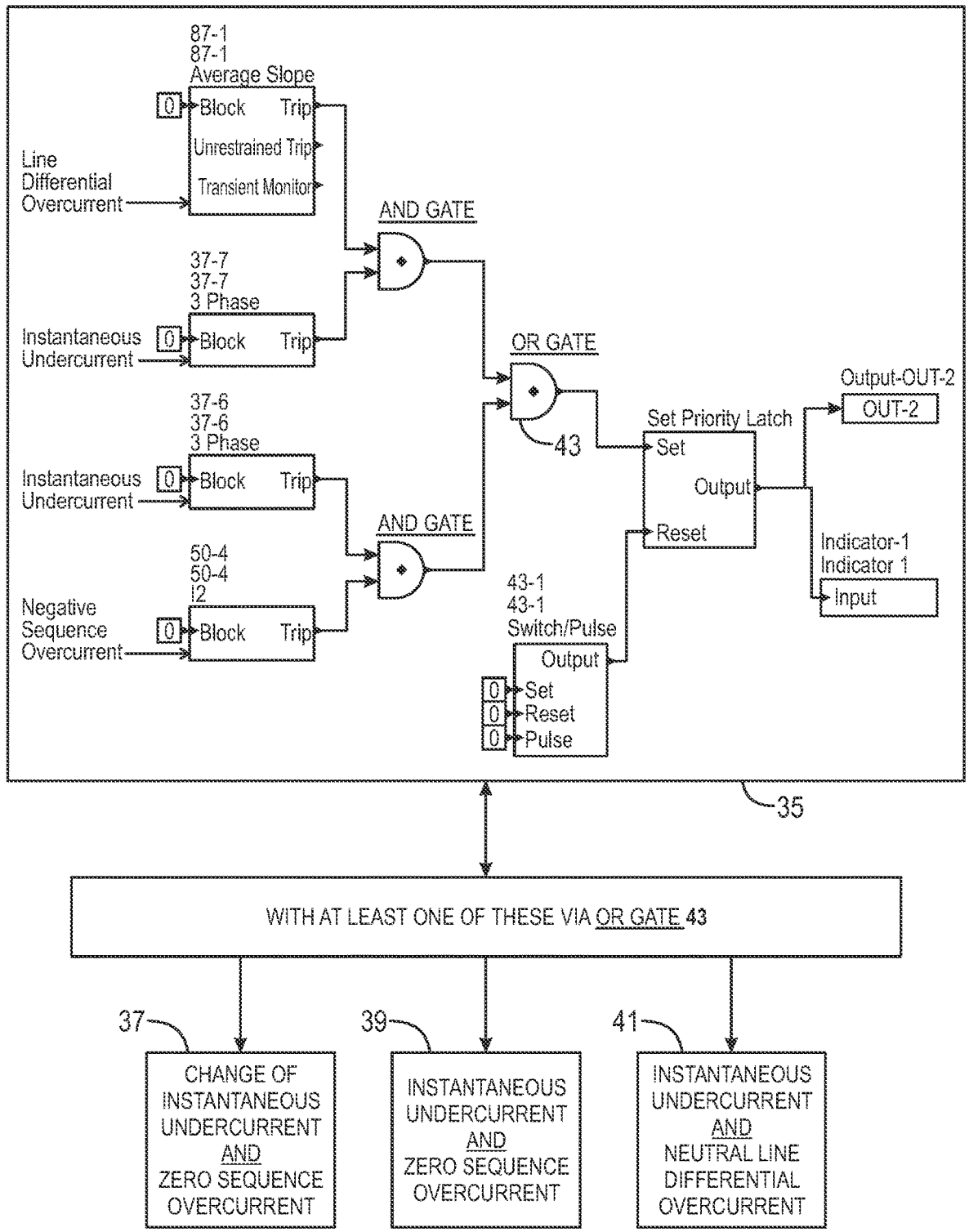

FIG. 2A shows the steps in the present invention high voltage transmission relay protection system, block 21, and preferred embodiments include these steps:

(1) deploy programmable, communicating relays along transmission lines, preferably at or near the substations, block 23. Communications must be very rapid, such as radio, and preferably optical fiber communications;

(2) program these relays to monitor micro changes in electric conditions, namely those shown in FIG. 2B, that is, instantaneous undercurrent, and one other of the aforesaid operating conditions, namely, selected from the group consisting of a) line differential overcurrent; b) negative sequence instantaneous overcurrent; (iii) neutral line differential overcurrent; (iv) zero sequence instantaneous overcurrent and (v) and combinations thereof along the lines to identify when a line break has occurred and to do so before the broken line creates a fault, block 25, (before it touches a tower, pole or ground), e.g., within a half-second and preferably within a few milliseconds. In some preferred embodiments, the instantaneous undercurrent is measured twice in quick succession (such as within a small fraction of a second) to look for changes in instantaneous undercurrent. For example, one preferred set of parameters may be instantaneous undercurrent and zero sequence overcurrent;

(3) rapidly communicate to the appropriate breakers to shut down the breakers at both ends of the break before the ground fault has occurred, block 27 (again within a half-second and preferably within a few milliseconds) to avoid collateral damage or catastrophe, had the ground fault actually occurred;

(4) shift or by-pass (isolate) power as quickly as possible to minimize disruption, block 29 (this occurs with existing equipment and grid configurations as the transmission system reconfigures);

(5) locate the broken line and repair/replace it, block 31, and;

(6) restore power to the previously broken line, block 33.

FIG. 2B, as mentioned, shows the details of the parameters to be monitored. In FIG. 2B, frame 35 illustrates the monitored parameters that are explicitly set out in the parent applications of this application, that is in U.S. Utility patent application Ser. No. 17/672,422, titled "Electric Transmission Line Ground Fault Prevention Methods Using Dual, High Sensitivity Monitoring", filed on 15 Feb. 2022, and is also a continuation-in-part of co-pending U.S. Utility patent application Ser. No. 17/693,504, titled "Electric Transmission Line Ground Fault Prevention Systems Using Dual, High Sensitivity Monitoring Devices", filed on Mar. 14, 2022. Thus, FIG. 2B, frame 35 shows two pairs of parameters to be monitored, namely instantaneous undercurrent and line differential overcurrent going through a first common AND GATE, and instantaneous undercurrent and negative sequence instantaneous overcurrent going through a second common AND GATE both AND GATTES feed into a single common OR GATE 43. The present invention combines these with three other pairs of parameters to fine tune and render the system more sensitive and more reliable to breaks in the line(s). Thus, as shown further in FIG. 2B, the diagram of frame 35 is combined with one or more pairs of additional parameters shown in frames 37, 39 and 41. In other words, the frame 35 components/parameters are combined with frame 37 and/or frame 39 and/or frame 42, and therefore, any one of these, any two of these and all three of these. When any one of these is included, OR GATE 43 will have three feeds. When any two of these are included, OR GATE 43 will have four feeds. If all three (frames 37, 39 and 41) are included, then OR GATE 43 will have a preferred five feeds. Table 1, below illustrates some possible present invention monitored parameter possible combinations.

TABLE 1

SOME POSSIBLE PRESENT INVENTION PAIRED MONITORED PARAMETER COMBINATIONS

| EMBODIMENT 1 | | | |
|---|---|---|---|
| Instantaneous undercurrent | | AND | Line differential overcurrent |
| | OR | | |
| Instantaneous undercurrent | | AND | Negative sequence instantaneous overcurrent |
| | OR | | |
| Instantaneous undercurrent | | AND | Neutral line differential overcurrent |

TABLE 1-continued

SOME POSSIBLE PRESENT INVENTION PAIRED MONITORED
PARAMETER COMBINATIONS

EMBODIMENT 2

| | | | |
|---|---|---|---|
| Instantaneous undercurrent | | AND | Line differential overcurrent |
| | OR | | |
| Instantaneous undercurrent | | AND | Negative sequence instantaneous overcurrent |
| | OR | | |
| Instantaneous undercurrent | | AND | Zero sequence instantaneous overcurrent |

EMBODIMENT 3

| | | | |
|---|---|---|---|
| Instantaneous undercurrent | | AND | Line differential overcurrent |
| | OR | | |
| Instantaneous undercurrent | | AND | Negative sequence instantaneous overcurrent |
| | OR | | |
| Change in instantaneous undercurrent | | AND | Zero sequence instantaneous overcurrent |

EMBODIMENT 4

| | | | |
|---|---|---|---|
| Instantaneous undercurrent | | AND | Line differential overcurrent |
| | OR | | |
| Instantaneous undercurrent | | AND | Negative sequence instantaneous overcurrent |
| | OR | | |
| Instantaneous undercurrent | | AND | Zero sequence instantaneous overcurrent |
| | OR | | |
| Instantaneous undercurrent | | AND | Neutral line differential overcurrent |

EMBODIMENT 5

| | | | |
|---|---|---|---|
| Instantaneous undercurrent | | AND | Line differential overcurrent |
| | OR | | |
| Instantaneous undercurrent | | AND | Negative sequence instantaneous overcurrent |
| | OR | | |
| Change in Instantaneous undercurrent | | AND | Zero sequence instantaneous overcurrent |
| | OR | | |
| Instantaneous undercurrent | | AND | Neutral line differential overcurrent |

EMBODIMENT 6

| | | | |
|---|---|---|---|
| Instantaneous undercurrent | | AND | Line differential overcurrent |
| | OR | | |
| Instantaneous undercurrent | | AND | Negative sequence instantaneous |
| | OR | | |
| Change in Instantaneous undercurrent | | AND | Zero sequence instantaneous overcurrent |
| | OR | | |
| Instantaneous undercurrent | | AND | Zero sequence instantaneous overcurrent |

EMBODIMENT 7

| | | | |
|---|---|---|---|
| Instantaneous undercurrent | | AND | Line differential overcurrent |
| | OR | | |
| Instantaneous undercurrent | | AND | Negative sequence instantaneous overcurrent |
| | OR | | |
| Change in Instantaneous undercurrent | | AND | Zero sequence instantaneous overcurrent |
| | OR | | |
| Instantaneous undercurrent | | AND | Zero sequence instantaneous overcurrent |
| | OR | | |
| Instantaneous undercurrent | | AND | Neutral line differential overcurrent |

All of the ORs shown above in Table 1 for every embodiment should be understood to collectively represent a single OR GATE. All of the above embodiments are extremely reliable to detect and shut down broken line(s) before they contact a ground to cause a serious, dangerous fault. However, the more parameters being monitored, the more reliable a present invention system becomes. Therefore, embodiments with four pairs of parameters are more reliable than those with three pairs of parameters and are, thus, preferred. Most preferred is Embodiment 6 where all five pairs are included and the five ORs shown in Table 1 for this embodiment, represent a single five-feed OR GATE. By the present methods and devices, the speed in which the monitoring and corrective action takes place is a fraction of a second or a second. Due to the present invention methods shut down before a fault occurs, no damage results and easier, safer and quicker broken line repair is achieved.

Figure 3:
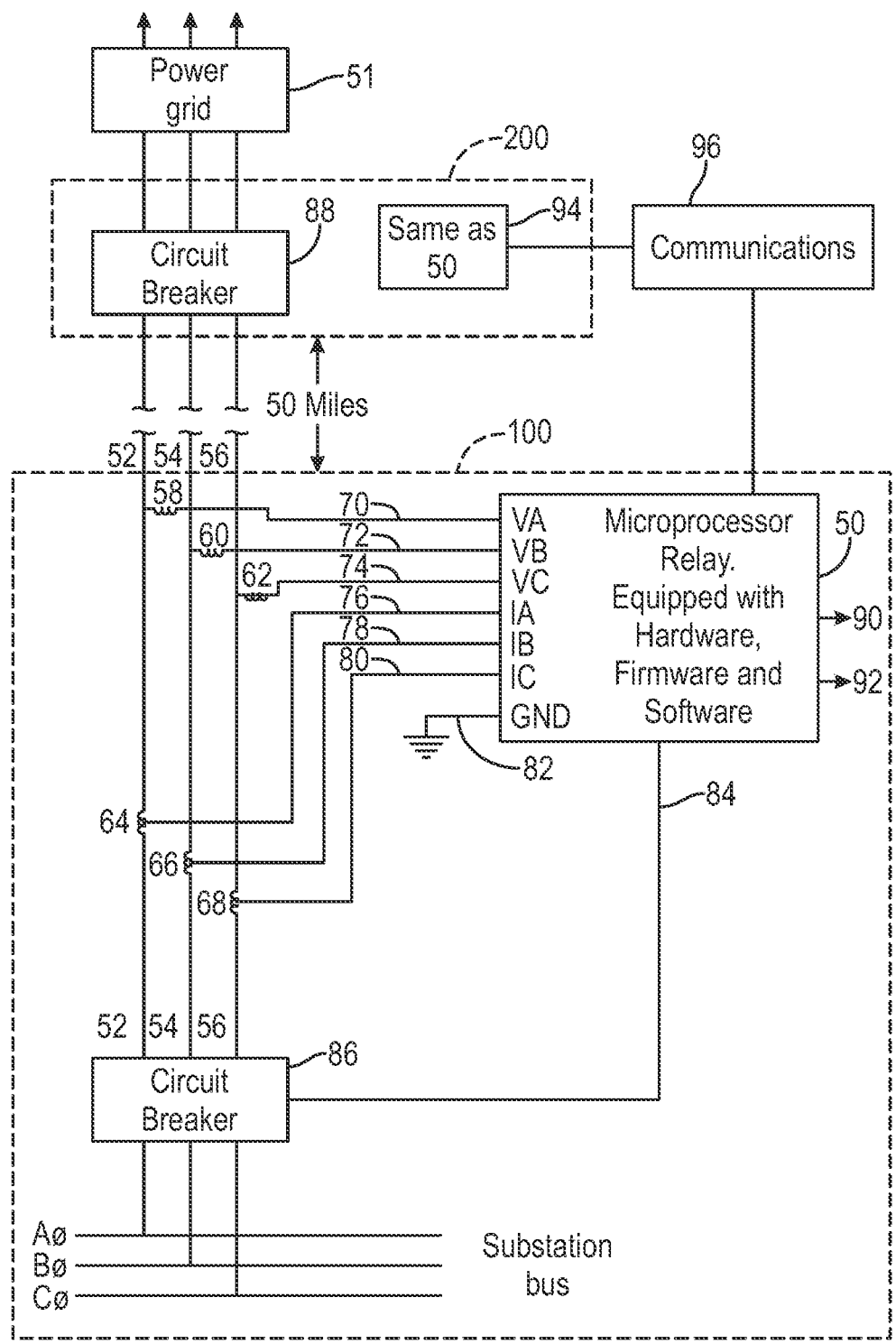
FIG. 3 illustrates a diagram of a present invention protection system using two programmable relays located at opposing substations and monitoring at least two, and preferably at least three of the aforesaid conditions on all three lines (also referred to as wires, wire conductors, conductor wires or conductors herein) at both substations.

FIG. 3 illustrates a diagram of a present invention protection system using two programmable relays located at opposing substations and monitoring at least pairs of selected conditions that are set forth above. Additional conditions could be added, such as may be described below in conjunction with the gates.

One of these two relays is shown in greater detail than the other, but both are identical. In FIG. 3, a structurally conventional relay device 50 is shown with a present-day relay microprocessor with computer software, hardware, and firmware that processes the software for adjusting the input parameters of the electric conditions, voltages and currents, to determine when adverse conditions occur. A second, identical relay 94 is also shown. These two relays 50 and 94 are programmed differently from normal relays used in the industry, as they are programmed to measure sensitive readings and not large readings, and, more specifically, are programmed to measure/monitor changes that occur before the fault occurs. These "micro" changes relate to what occurs at the broken ends of a line before either end touches anything to short or ground. Such readings are bypassed, or ignored, by the prior art systems programming, as breakers are not tripped in the prior art systems until after the short or fault occurs. Here the aforementioned conditions are monitored and when they deviate from the preset acceptable operating ranges, the breakers are tripped. These relays send trip signals to the circuit breaker(s) within a second, and even within 20 or so milliseconds to de-energize the line. In preferred embodiments, the present invention relays are programmed to monitor in both directions (upstream and downstream from current flow) and trip both related breakers.

Table 2 lists the various components of the present invention protection system shown in FIG. 3, and the detailed relationship of each component is set forth below Table 2:

TABLE 2

FIG. 3 PRESENT INVENTION SYSTEM COMPONENTS OF FIG. 3

(Drawing Reference Number and Component)

| | |
|---|---|
| 50 | Present Invention First Relay. |
| 51 | Three Phase Power Grid. |
| 52 | A phase transmission line conductor. |
| 54 | B phase transmission line conductor. |
| 56 | C phase transmission line conductor. |
| 58 | A phase potential transformer. |
| 60 | B phase potential transformer. |
| 62 | C phase potential transformer. |
| 64 | A phase current transformer. |
| 66 | B phase current transformer. |
| 68 | C phase current transformer. |
| 70 | Wire connecting 58 to relay 50 for A phase voltage input. (VA) |
| 72 | Wire connecting 60 to relay 50 for B phase voltage input. (VB) |
| 74 | Wire connecting 60 to relay 50 for C phase voltage input. (VC) |
| 76 | Wire connecting 64 to relay 50 for A phase current input. (IA) |
| 78 | Wire connecting 66 to relay 50 for B phase current input. (IB) |
| 80 | Wire connecting 68 to relay 50 for C phase current input. (IC) |
| 82 | Wire connecting ground to relay 50 for ground potential for use in relay 50. (GND) |
| 84 | Wire connecting the trip signal from Relay 50 to Circuit Breaker 86. |
| 86 | Circuit Breaker associated with the downed conductor detection system connected to Relay 50. |
| 88 | Circuit Breaker associated with the transmission line at the other end of the line, associated with the downed conductor detection system connected to Relay 94. |

TABLE 2-continued

FIG. 3 PRESENT INVENTION SYSTEM COMPONENTS OF FIG. 3

(Drawing Reference Number and Component)

| | |
|---|---|
| 90 | Communications port to send and receive data communications. |
| 92 | Communications port for testing Relay 50 and for making software changes and modifying relay settings. |
| 94 | Present Invention Second Relay. |
| 96 | Communication Center between Relays 50 and 94. |
| 100 | First Substation. |
| 200 | Second Substation (next downstream from First Substation. |

The transmission lines of power grid 51 transport electric power to be delivered to meet customer demand. At the power generation end, a step-up transformer substation transmits the power through the transmission lines at very high voltages, and at the downstream end, a step-down transformer sends power through a distribution line at normal voltages. In between the beginning and end of a power grid, numerous intermediate substations are positioned to distribute power to local users. In this FIG. 3, adjacent (First and Second) substations 100 and 200 are shown to be 50 miles apart. Relay 50 monitors the currents in electric power grid 51 on the specific transmission line associated with this specific transmission line linked to Relay 50 at First Substation 100. The power grid 51 transmission system is a three-phase system to transport power over long distances to safely and economically deliver energy to meet customer demand. The power grid 51 illustrated in this Figure is a three-phase alternating current system represented by transmission line conductors 52, 54, and 56. Relay 50 monitors or senses the current and voltage levels in each of the phases of the three-phase system. A circuit breaker 86 is provided for disconnecting the transmission line being protected from the power grid 51 when a conductor (wire) fails for any reason, such as a broken conductor (wire), a failed splice, gunshot damage, failed connectors or other components resulting in an open conductor condition.

Relay 50 receives input voltages from A, B, C phase potential transformers 58, 60, and 62 on transmission line conductors 52, 54, and 56, and the proportional values are connected to Relay 50 by wires 70, 72 and 74 to provide proportional voltage values to Relay 50 connections at VA, VB and VC, respectively.

Current levels on the transmission line conductors 52, 54, and 56 are performed by connecting a current transformer or some type of coupling capacitor voltage transformer, or other current sensing device to the line conductors 52, 54 and 56 at A, B, C phase current transformers 64, 66 and 68. The current flow output of A, B, C phase current transformers 64, 66 and 68 are directly proportional to the line currents in line conductors 52, 54 and 56. These current transformers 64, 66 and 68 are physically connected or magnetically coupled to each line as shown in the Figure. The primary windings of transformers 64, 66, and 68 are energized in accordance with the line currents in line conductors 52, 54, and 56, respectively. The secondary windings of the transformers 64, 66 and 68 are connected to Relay 50 via lines 76, 78 and 80, respectively at IA, IB and IC. Relay 50 is connected to the circuit breaker 86 via wire 84 connection at Relay 50 and terminating at the associated circuit breaker. This is commonly known as output contacts to perform the trip function located in the circuit breaker control cabinet. Wire 82 connects relay 50 to ground GND, as shown.

There is a second present invention Relay 94 at substation 200 with circuit breaker 88, that is 50 miles downstream from substation 100. Relay 94 is identical to Relay 50 and therefore its details are not repeated.

Relay 50 includes a communications port 90, such as a RS-485 serial port, or RS-232 or Fiber Optic connection which is used to transfer data to/from a remote location communications center 96 and as a direct link between Relay 50 at substation 100 of a transmission line, and, Relay 94 at the next substation 200 at the other end of the transmission line to communicate the status of the line from both ends. Relay 50 also includes a second communications port 92, such as a USB port which is provided for testing and local programming of Relay 50.

The relays 50 and 94 are coordinated by their programming and communications center 96. In these preferred embodiments, at a minimum each relay would monitor three lines for capacitive potential or capacitive current to recognize deviations from preset (programmed) acceptable operating ranges. More preferably, they each monitor the three lines for the present invention pairs of parameters such as are shown in table 1, and most preferably the five-feed OR Gate system of Embodiment 7, to recognize deviations from preset (programmed) acceptable operating ranges and to respond to such deviations by shutting down the relevant power. In some preferred embodiments, the current magnitudes and phase angles are compared. Degree of phase synchronization may be determinative or contribute to the analysis to determine whether a significant enough deviation has occurred to trigger tripping breakers.

Figure 4:
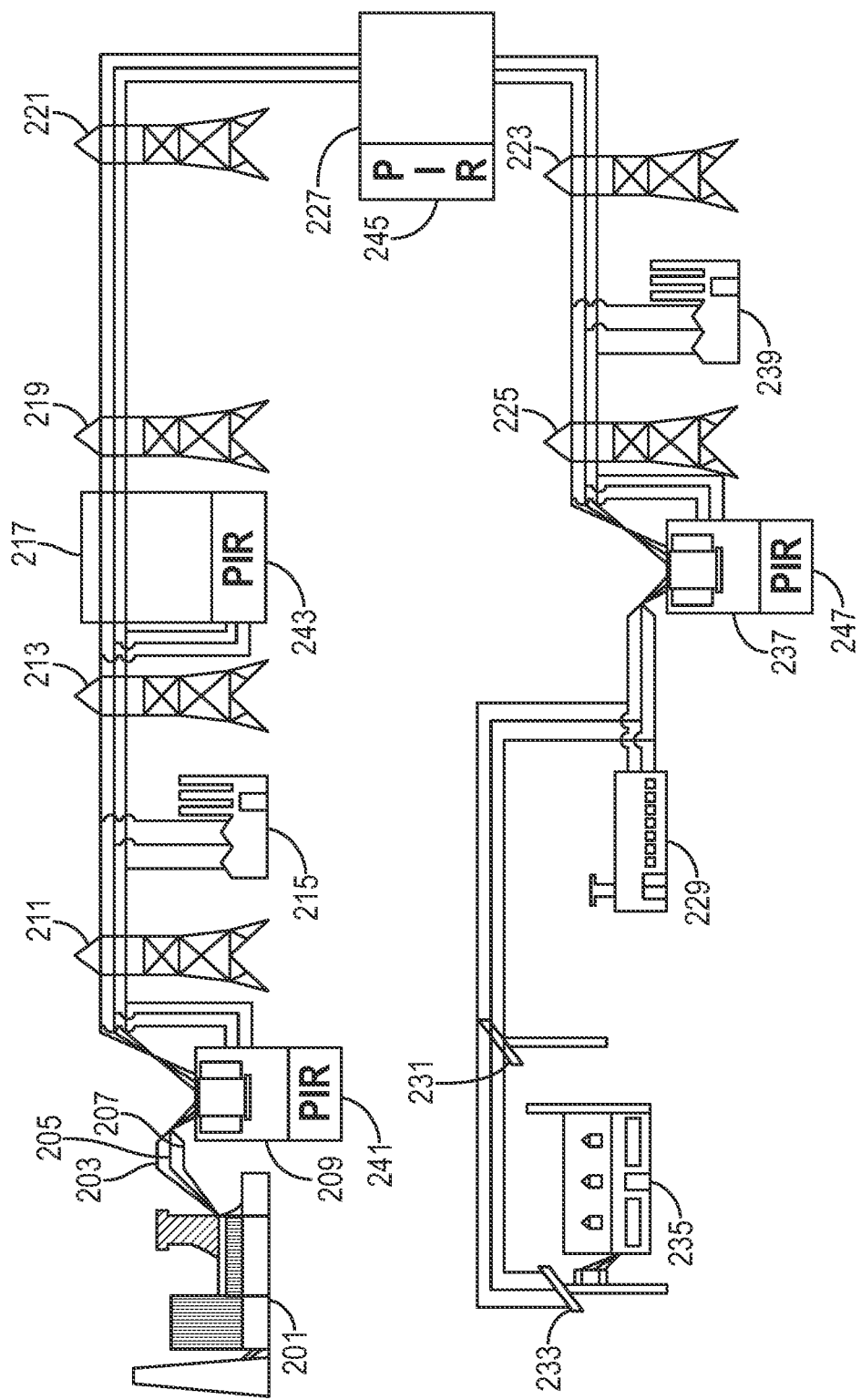
FIGS. 4 and 5 show high voltage transmission lines before a break and after a break (before shorting), respectively, with present invention relays (PIRs) at each substation.
Figure 5:
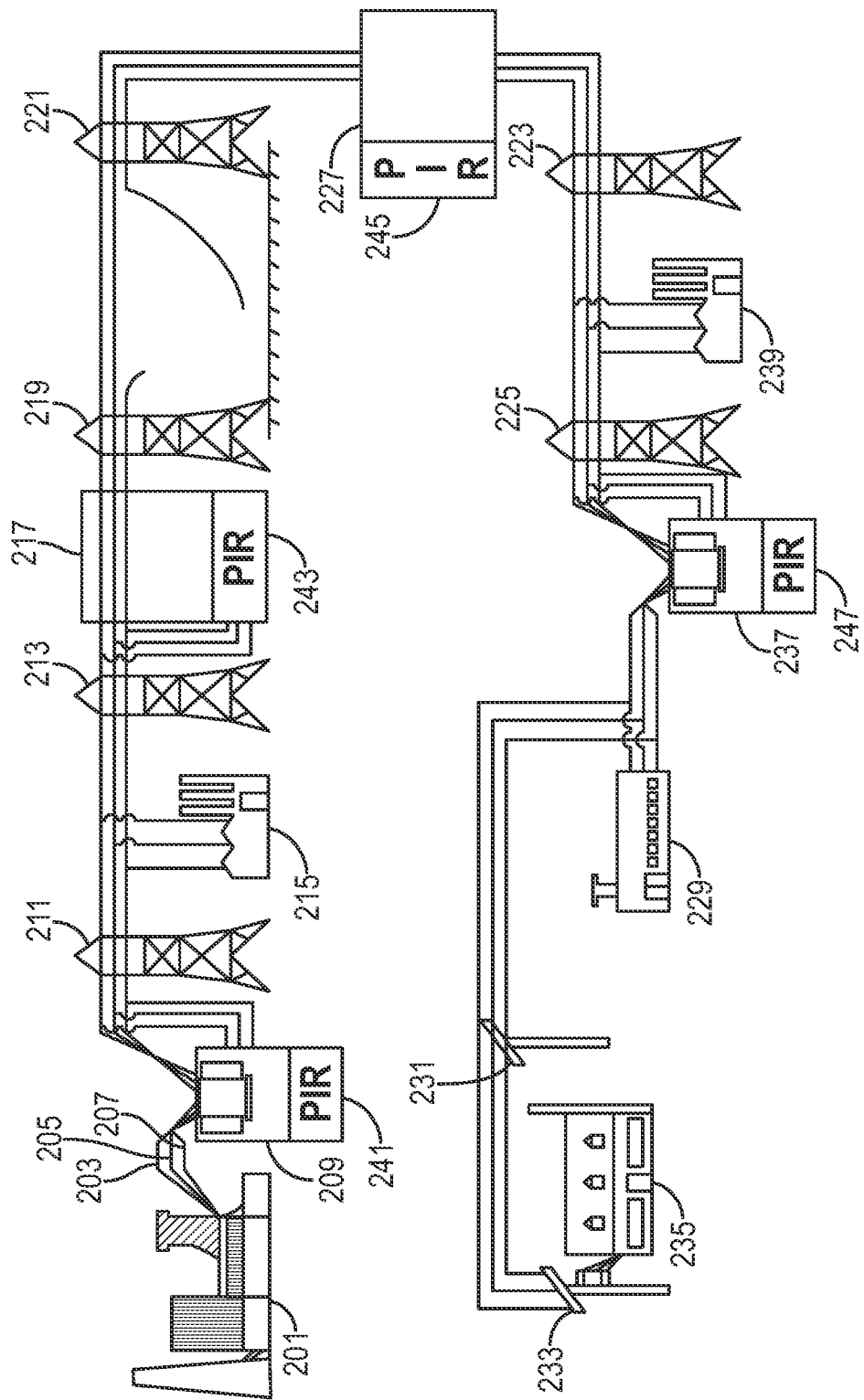

FIGS. 4 and 5 show high voltage transmission lines before a break and after a break (before shorting), respectively, with present invention relays (PIRs) at each substation. Both Figures are taken together in this discussion and identical components are identically numbered. A power generating station 211 generates three phase electricity transmitted by lines 203, 205 and 207 to step-up substation 209. Substation 209 has a present invention relay PIR 241 that functions in like fashion to relay 50 of FIG. 3. The power is transmitted at high voltage over the three phase lines from tower 211 to subsequent towers 213, 219, 221, 223 and 225. There are large industrial consumers that draw from these lines such as factories 215 and 239. There are substations along the way, including substations 217, 227 and 237 and each has a Present Invention Relay 243, 245 and 247 respectively, such as described above in conjunction with relay 50 of FIG. 3. The substations are step-down substations (with a step-down transformer to reduce voltage) that distribute power to users via conventional poles 231 and 233 to users such as school 229 and residence 235. Because the PIRs monitor upstream and downstream, when a line breaks (as shown in FIG. 5 between towers 219 and 221) the nearest upstream and downstream PIRs (243 and 245) monitoring the aforesaid conditions, will see deviant conditions generated from both ends of the break, and will direct a breaker tripping associated with those two substations (217 and 227) for the broken line before the broken line segments (ends) touch a tower or ground or other short. This happens in less than 25 milliseconds and completely prevents any short or ground from occurring and eliminates any collateral damage or worse-catastrophic damage to person, structure, animal, flora and fauna.

FIGS. 6, 7, 8 and 9 show various present invention AND gate/OR gate arrangements used to monitor conditions and initiate breaker tripping to prevent ground faults after a line break and before a line touches a tower, pole or ground. Identical components shown in more than one of these Figures are identically numbered, and discussion thereof is not repeated in detail, but otherwise incorporated by reference to its prior discussion.

Figure 6:
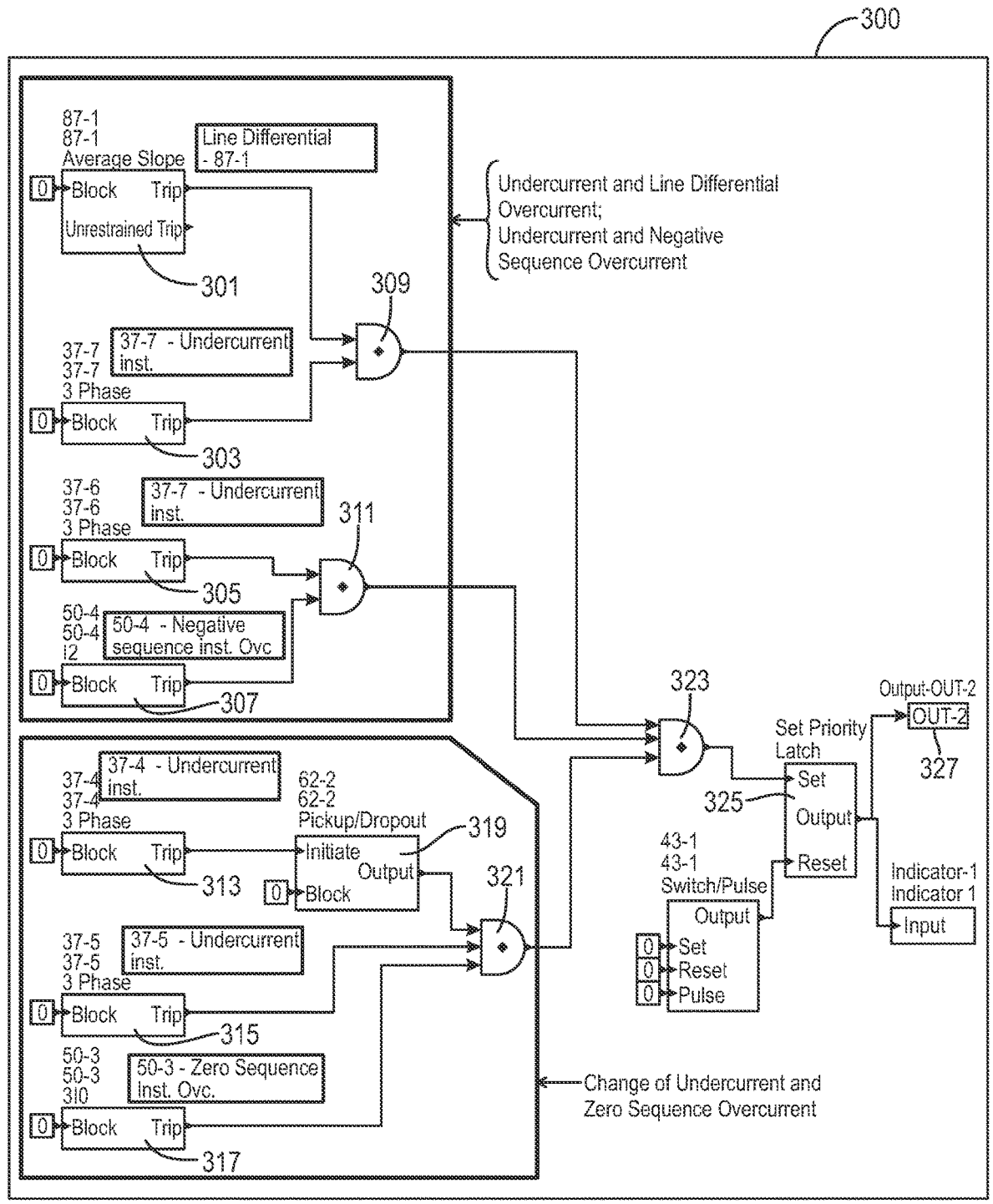
FIGS. 6, 7, 8 and 9 show various present invention AND gate/OR gate arrangements used to monitor conditions and initiate breaker tripping to prevent ground faults after a line break and before a line touches a tower, pole or ground.

In FIG. 6, gate diagram 300, the present invention AND gate 309 and AND gate 311 and AND gate 321 are connected to pairs of specific monitoring of parameters are used to require a tripping signal directive through OR gate 323 to output 327. At AND gate 309, simultaneous deviations from preset ranges for line differential overcurrent, block 301 and for instantaneous undercurrent, block 303, are necessary for an action signal to pass through AND gate 309. At AND gate 311, simultaneous deviations from preset ranges for instantaneous undercurrent, block 305 and for negative sequence overcurrent, block 307, are necessary for an action signal to pass through AND gate 311. At AND gate 319, simultaneous deviations from preset ranges for instantaneous undercurrent, block 313 and for zero sequence overcurrent, block 315, are necessary for an action signal to pass through AND gate 319. Once an action signal passes through one of these AND gates, OR gate 323 sends the trip output directive 325 via output 327 to trip the breakers.

Figure 7:
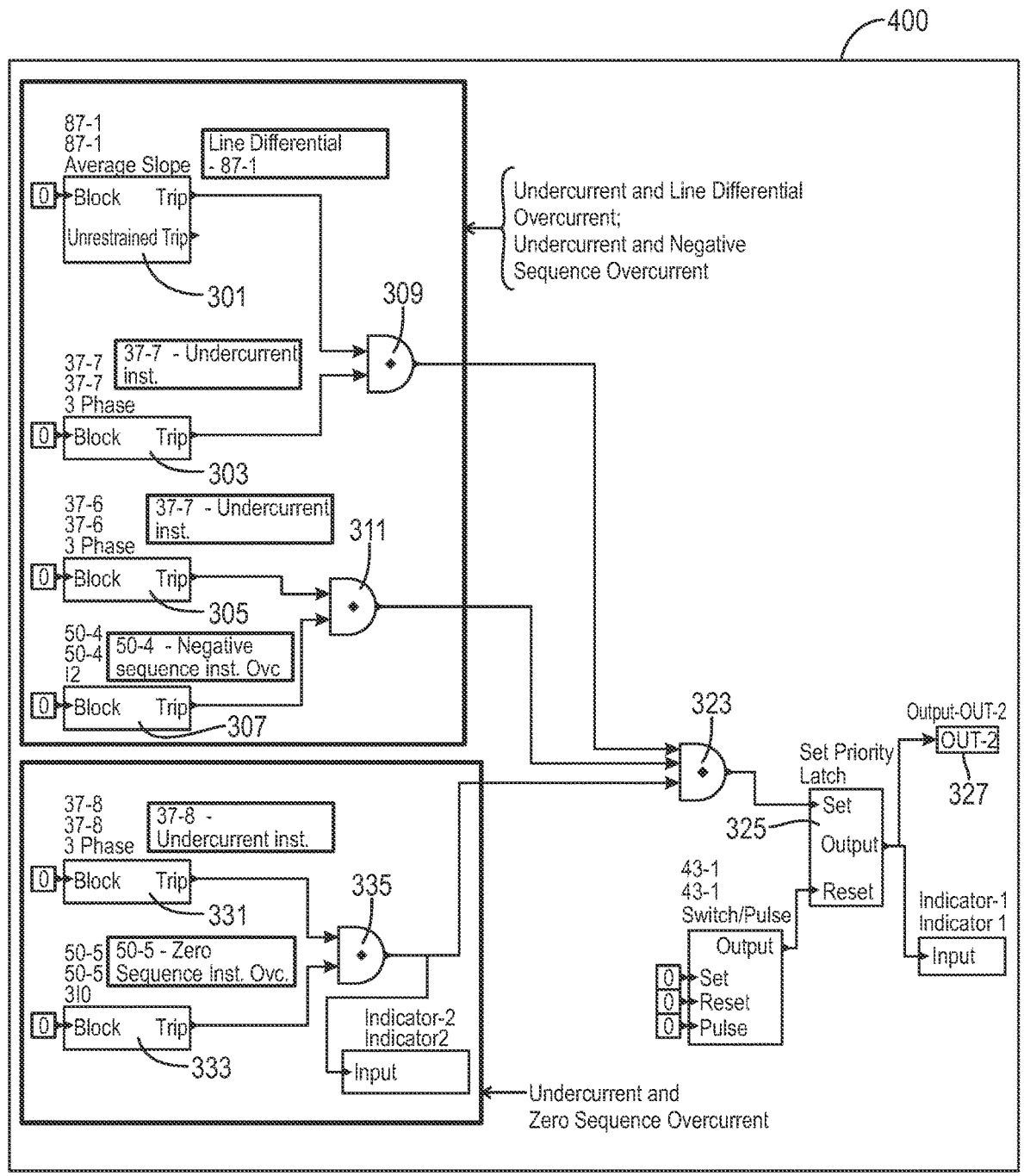

In FIG. 7, components shown in FIG. 6 are identically numbered here, except that there is a different AND gate 325 with a different parameter pair at the bottom of frame 400. This is gate 335, which illustrates another preferred embodiment of the present invention. Here at AND gate 335, simultaneous deviations from preset ranges for instantaneous undercurrent, block 331 and for zero sequence overcurrent, block 333, are both required for an action signal to pass through AND gate 335. Otherwise, OR gate 323 functions identically as described above—when a deviation occurs, and a signal passes through one or more of the AND gates, OR gate 323 sends the trip output directive 325 via output 327 to trip the breakers.

Figure 8:
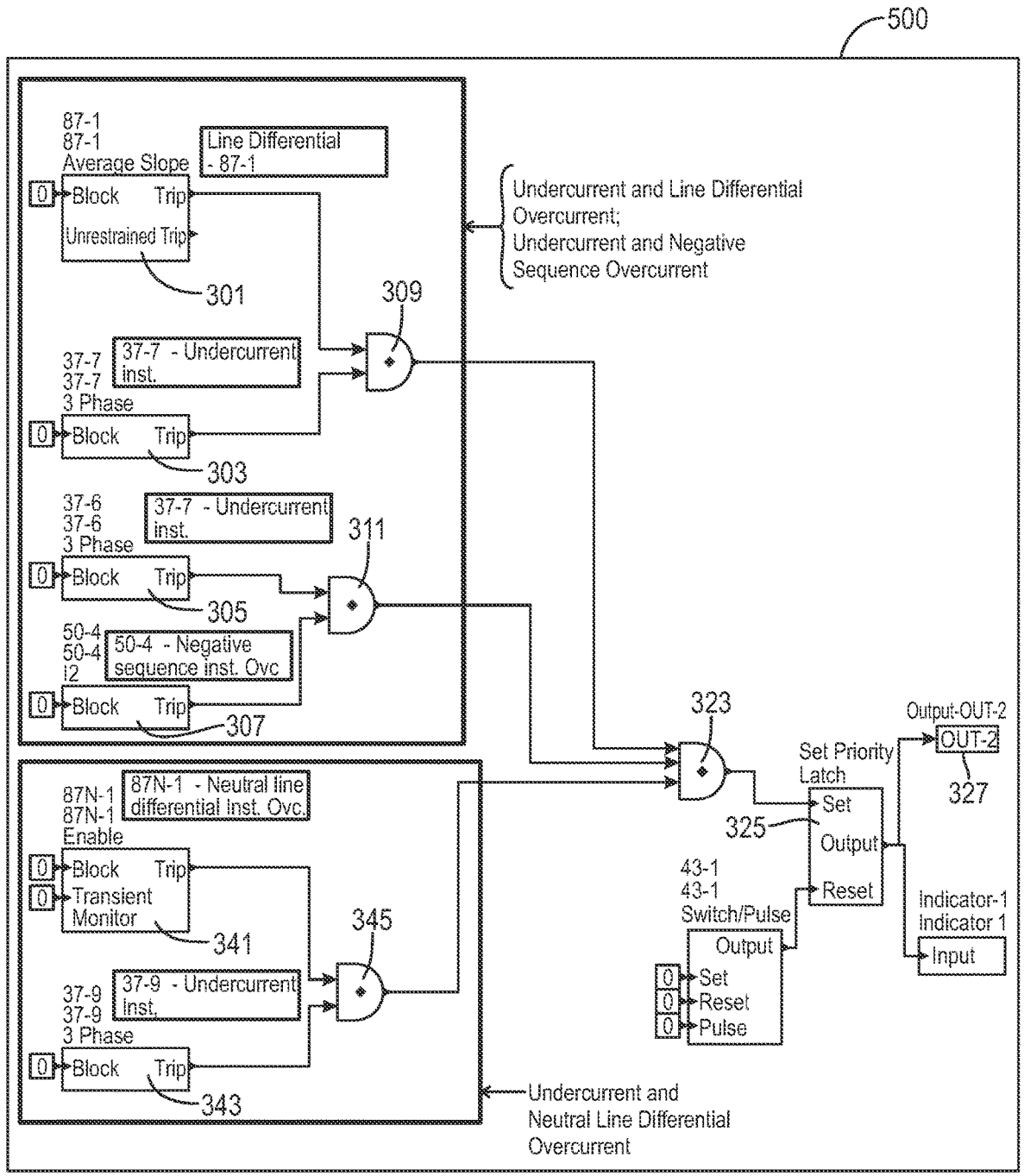

In FIG. 8, all that is shown in FIG. 6 is repeated and works the same way as in FIG. 6, except that there is a different third AND gate 345 at the bottom of frame 500. Here at AND gate 345, simultaneous deviations from preset ranges for a neutral line overcurrent, block 341, and instantaneous undercurrent, block 343, are both required for an action signal to pass through AND gate 345. Otherwise, OR gate 323 functions identically as described above—when a deviation occurs, and a signal passes through one or more of the AND gates, OR gate 323 sends the trip output directive 325 via output 327 to trip the breakers.

Each of FIGS. 6, 7 and 8 show three AND gates with pairs of parameters. However, as discussed above, four AND gates can be utilized. Thus, combinations of FIGS. 6 and 7, FIGS. 6 and 8, and FIGS. 7 an 8 are contemplated to be within the scope of the present invention.

Figure 9:
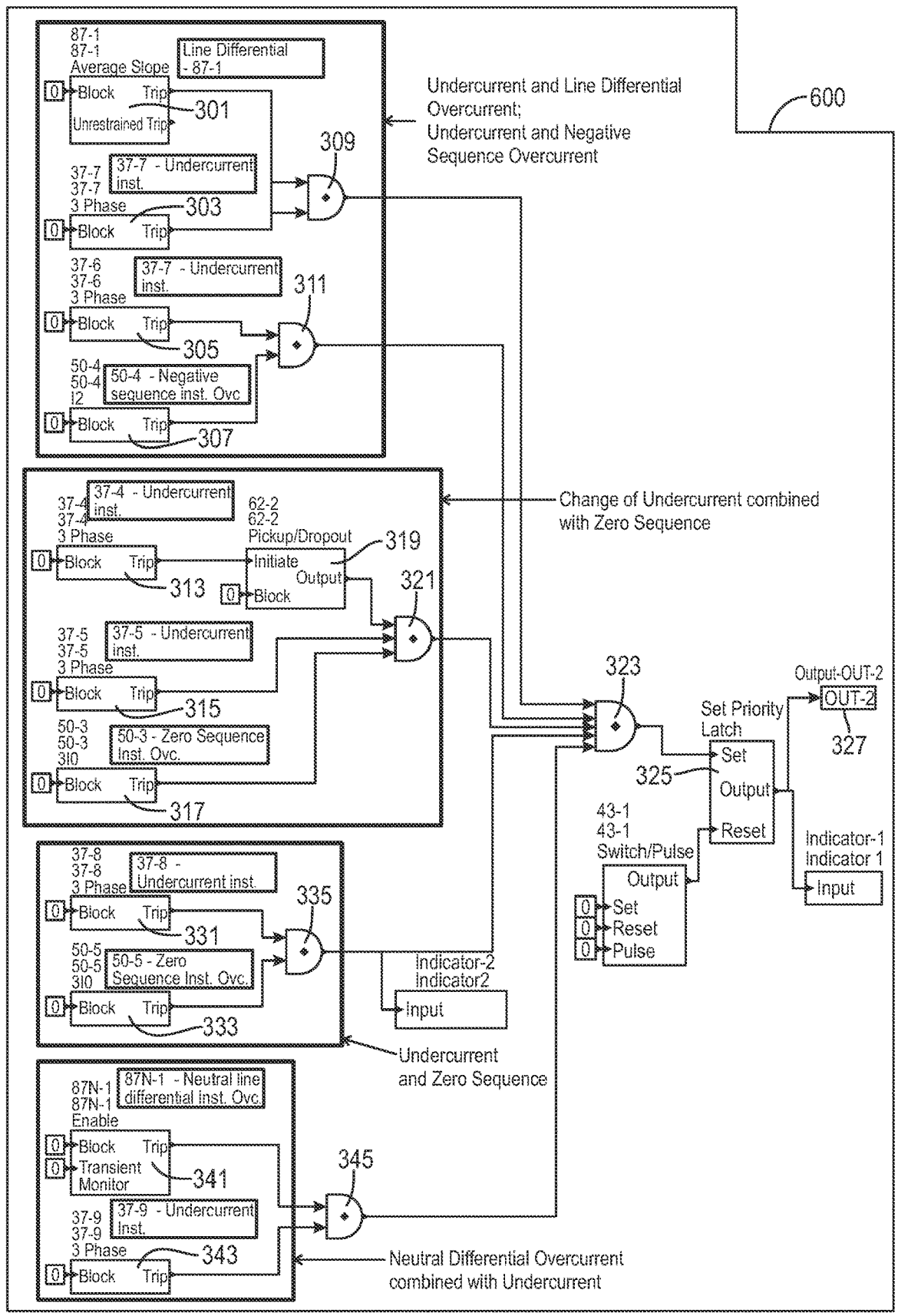

In FIG. 9, all that is shown in FIG. 6 is repeated and works the same way as in FIG. 6, except that there are now five AND gates, namely, AND gates 309, 311 and 321, 335 and 345, each functioning as set forth above in FIGS. 6, 7 and 8. This is the most preferred embodiment of the present invention. OR gate 323 functions identically as described above-when a deviation occurs, and a signal passes through one or more of the AND gates, OR gate 323 sends the trip output directive 325 via output 327 to trip the breakers.

While these gates assure reliability of the system by building redundancy into it, other variations for gate requirements within the various conditions monitored in the present invention may be alternatively be used without exceeding the scope of the present invention.

Figure 10:
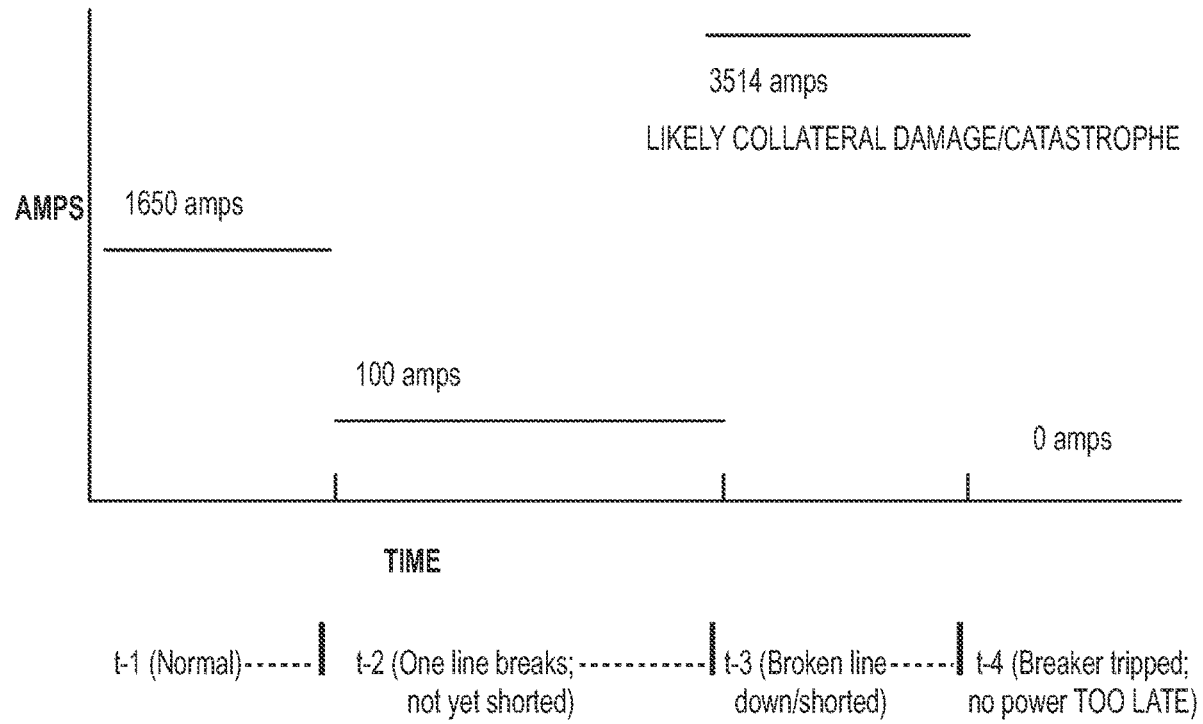
FIGS. 10 and 11, respectively, illustrate Prior Art protection systems and Present Invention protection systems analysis for an actual 500 kilovolt, 1500 amp high voltage transmission line, and the phenomenal ability of the present invention system to completely eliminate collateral and catastrophic damage that is possible to occur with the Prior Art systems.
Figure 11:
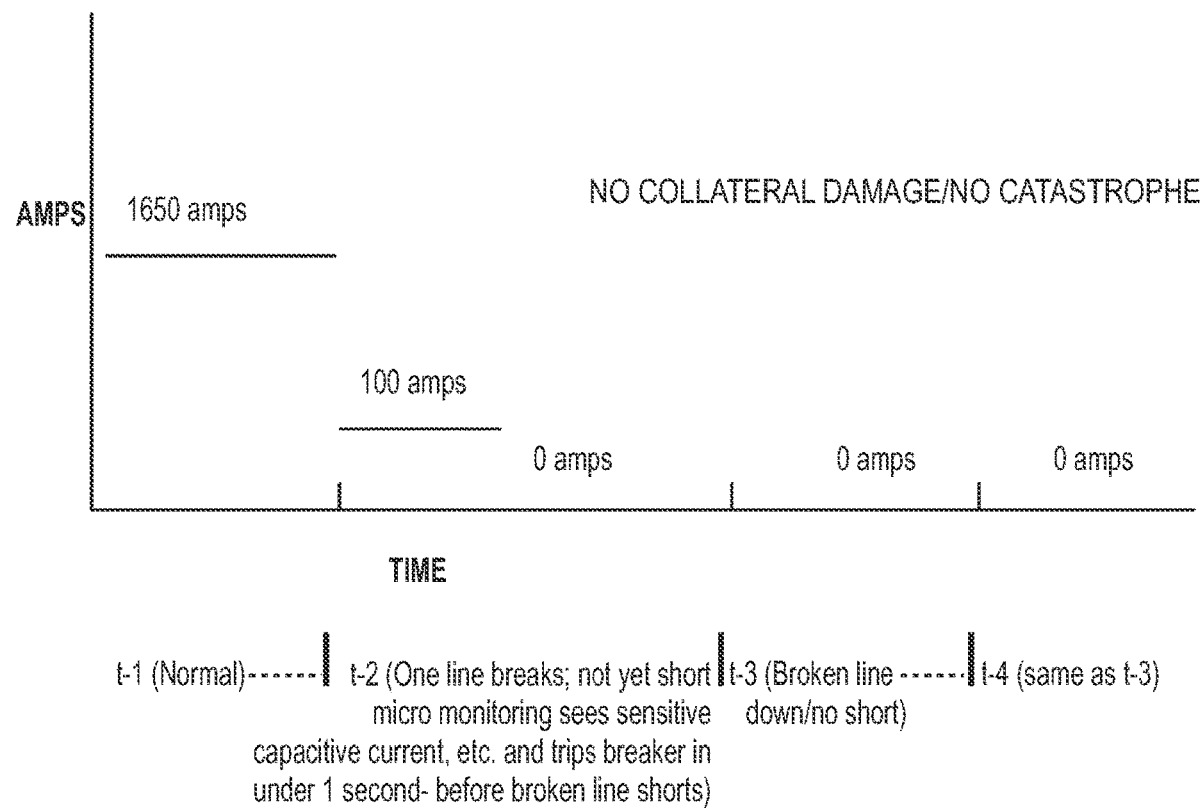

Examples 1 and 2—Prior Art Vs Present Invention Protection Systems—500 Kilovolts Transmission System FIGS. 10 and 11, respectively, illustrate Prior Art protection systems and Present Invention protection systems analysis for an actual 500 kilovolt, 1500 amp high voltage transmission line, and the significant ability of the present invention system to completely eliminate collateral and catastrophic damage that is possible or even likely to occur with the Prior Art systems.

In FIG. 10, Example 1, the prior art system of shutting down power after a fault is identified, is shown in graphic format as current vs. time. (Note that as to all FIGS. 10 through 13, the horizontal time segments and the vertical voltage segments are not intended to be proportional, only illustrative. The values in amps are accurate based on real conditions and calculations.) During t-1, the system is running with no breaks and hence has a normal average current of 1650 amps. At time t-2, a line breaks and current drops to approximately 100 amps. This when the broken line is falling but has not yet hit or touched a ground or short object, such as a tower or other structure or earth. This amperage stays at 100 until ground occurs at t-3, and then the current leaps to 3514 amps. This is enough to cause fires, destroy buildings and kill people, fauna and flora. At t-4, the breaker is tripped and current drops to 0, but it is too late as damage such as wildfires, has already occurred.

In FIG. 11, Example 2, the present invention system of shutting down power before a fault occurs, is shown in graphic format as current vs. time. During t-1, the system is running with no breaks and hence has a normal average current of 1650 amps. At time t-2, a line breaks and current drops to approximately 100 amps. This when the broken line is falling but has not yet hit or touched a ground or short object, such as a tower or other structure or earth. This amperage stays at 100 until the present invention recognizes micro condition changes and trips the breakers, typically within 20 to 30 milliseconds, and thus, no ground occurs at t-3. The current remains at 0 amps. Because no fault or short occurs, all possibility to cause fires, destroy buildings and kill people, fauna and flora, are mitigated or eliminated. At t-4, the breaker has already been tripped and current remains at 0, until repair and restoration are completed, and then, the transmission is back to normal.

Figure 12:
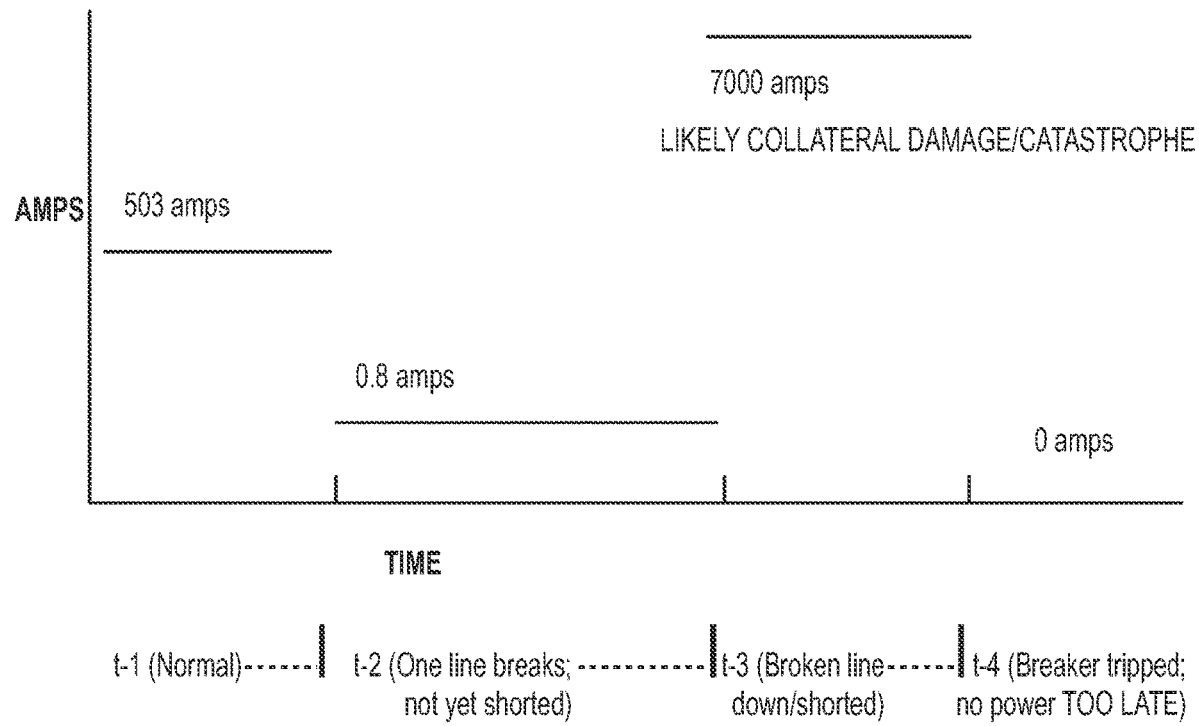
FIGS. 12 and 13, respectively, illustrate Prior Art protection systems and Present Invention protection systems analysis for an actual 115 kilovolt, 100 amp high voltage transmission line, and the phenomenal ability of the present invention system to completely eliminate collateral and catastrophic damage that is possible to occur with the Prior Art systems.
Figure 13:
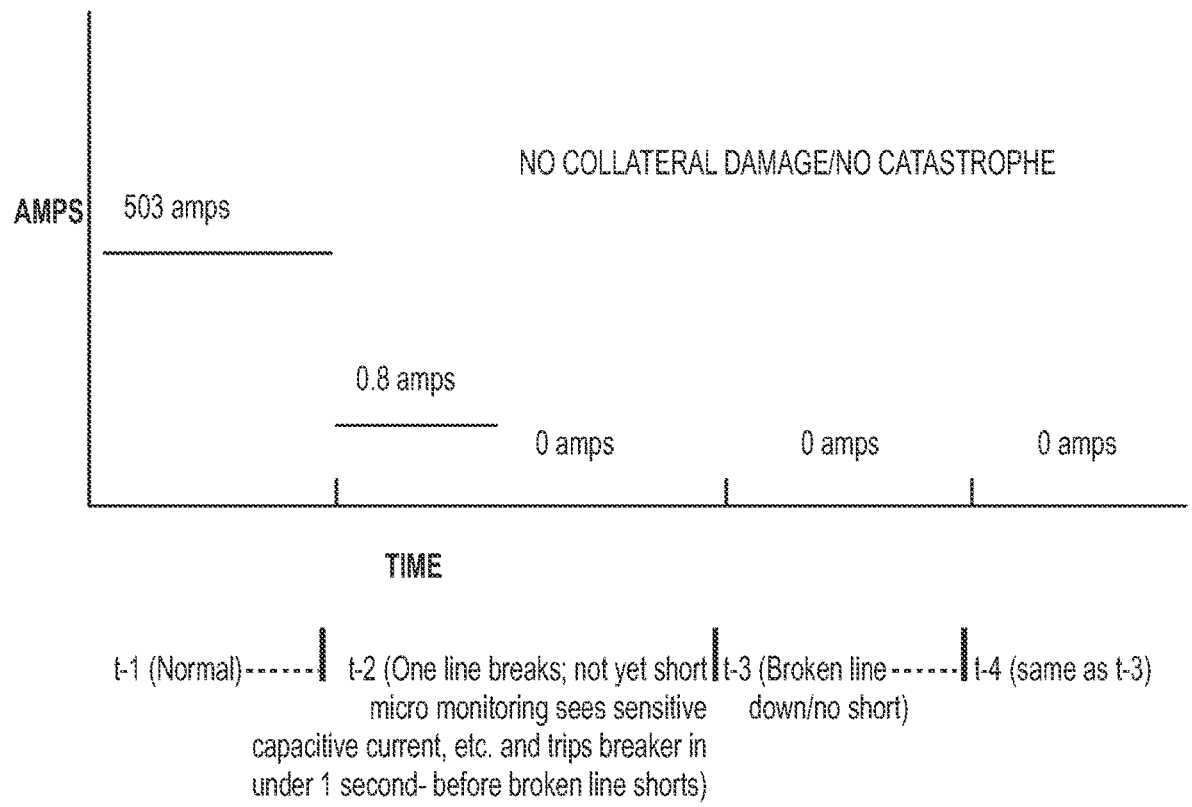

Examples 3 and 4—Prior Art Vs Present Invention Protection Systems—115 Kilovolts Transmission System FIGS. 12 and 13, respectively, illustrate Prior Art protection systems and Present Invention protection systems analysis for an actual 115 kilovolt, 100 amp high voltage transmission line, and the phenomenal ability of the present invention system to completely eliminate collateral and catastrophic damage that is possible to occur with the Prior Art systems. In these examples, FIGS. 12 and 13 are compared: At time t-1, the system is running normal and the current is 503 amps, when at time t-2, a line break occurs, the current in the broken line drops to about 0.8 amps. This when the broken line is falling but has not yet hit or touched a ground or short object, such as a tower or other structure or earth. This amperage stays at 0.8 and in the prior art Example 3, FIG. 12, when the short or fault occurs, the current jumps to 7000 amps with potentially catastrophic consequences. In the present invention Example 4, still in the time frame of t-2, the present invention recognizes micro condition changes and trips the breakers, typically within 20 to 30 milliseconds, and thus, no ground occurs at t-3. The current remains at 0 amps. Because no fault or short occurs, all possibility to cause fires, destroy buildings and kill people, fauna and flora, are mitigated or eliminated. At t-4, the breaker has already been tripped and current remains at 0, until repair and restoration are completed, and then, the transmission is back to normal.

Although particular embodiments of the invention have been described in detail herein with reference to the accompanying drawings, it is to be understood that the invention is not limited to those particular embodiments, and that various changes and modifications may be affected therein by one skilled in the art without departing from the scope or spirit of the invention as defined in the appended claims. For example, the shapes of the various components herein may be changed; specific relays may be modified or enhanced; communications may be by radio or fiber optics or by any rapid communication system that is or becomes available.

What is claimed is:

1. A method for preventing ground fault or other short circuit in a three-phase electric transmission line system having at least three lines, caused by a break in a line, which comprises:

providing a programmable relay protection system, including a plurality of relay devices on each line of said electric transmission line system, said relay protection system being programmed to monitor changes in: low instantaneous undercurrent due to line changing current, small levels of negative sequence instantaneous overcurrent due to at least one phase being an open phase, instantaneous undercurrent due to less load being served, increased negative sequence instantaneous overcurrent due to load imbalance, and zero sequence instantaneous overcurrent and neutral line differential overcurrent, wherein said relay devices include:

a) preset parameter ranges multiple high sensitivity electric operating conditions, said preset ranges being acceptable operating parameter ranges, a first of operating conditions being instantaneous undercurrent, and a second of said operating conditions being selected from the group consisting of a) line differential overcurrent; b) negative sequence instantaneous overcurrent; c) neutral line differential overcurrent; d) zero sequence instantaneous overcurrent and e) combinations thereof;

b) monitoring each line at each of said plurality of relay devices for said at least two operating conditions, wherein said plurality of relay devices are programmed to be highly sensitive so as to monitor and measure instantaneous undercurrent in the range of 0.01 to 0.5 amp, so as to monitor and measure line different overcurrent in the range of 0.01 to 0.5 amp, so as to monitor and measure negative sequence instantaneous overcurrent in the range of 0.01 to 0.5 amp, as to monitor and measure neutral line differential overcurrent in the range of 0.01 to 0.5 amp, so as to monitor and measure zero sequence instantaneous overcurrent in the range of 0.01 to 0.5 amp, so as to monitor and measure and;

c) permitting closed circuit operation when all of said lines show said operating conditions are within said preset acceptable operating parameter ranges, said preset operating range for negative sequence overcurrent being 0.01 amps to 0.5 amps, and said preset operating range for instantaneous undercurrent being 0.01 amps to 0.5 amps;

d) when a line is broken, identifying a first monitor reading for undercurrent caused by instantaneous undercurrent below 0.5 amps; identifying a second monitor reading for instantaneous undercurrent caused by at least one phase being below 4.9 amps, after said first and second monitor readings, said third monitor reading for zero sequence overcurrent caused by load unbalance due to said broken line above 0.01 amps; identifying a fourth monitor reading for instantaneous undercurrent caused by undesired current imbalance of 0.1 amps to collectively sense a broken line;

e) tripping a circuit breaker on a broken line when a line shows said at least two operating conditions are outside said preset parameter ranges for all of said first and second and third and fourth monitor readings as set forth in paragraph d) above; such that said relay protection system communicates to open said circuit breaker on said broken line within 1.0 second, thereby shutting down power to said broken line before it otherwise causes a ground fault or other short circuit.

2. The method for preventing ground fault or other short circuit in a three-phase electric transmission line system of claim 1 wherein said plurality of relay devices on each line is programmed to monitor both upstream and downstream from each of said plurality of relay devices such that when a line is broken, the monitored operating conditions of both ends of the break are recognized and reported in the system to effect said shutting down power to said broken line by tripping two circuit breakers, one being upstream from the break and the other being downstream from the break.

3. The method for preventing ground fault or other short circuit in a three-phase electric transmission line system of claim 1 wherein said programmable relay protection system plurality of relay devices are programmed to monitor line instantaneous undercurrent, and to monitor sensitive zero sequence instantaneous overcurrent.

4. The method for preventing ground fault or other short circuit in a three-phase electric transmission line system of claim 1 wherein said programmable relay protection system plurality of relay devices are programmed to monitor line instantaneous undercurrent, and to monitor neutral line differential overcurrent.

5. The method for preventing ground fault or other short circuit in a three-phase electric transmission line system of claim 1 wherein said programmable relay protection system plurality of relay devices are programmed to monitor changes in line instantaneous undercurrent, and to monitor zero sequence instantaneous overcurrent.

6. The method for preventing ground fault or other short circuit in a three-phase electric transmission line system of claim 1 wherein said plurality of relay devices are programmed to monitor instantaneous undercurrent, and a second operating condition of said operating conditions being selected from the group consisting of a) line differential overcurrent; b) negative sequence instantaneous overcurrent; and to further monitor line instantaneous undercurrent in combination with zero sequence instantaneous overcurrent.

7. The method for preventing ground fault or other short circuit in a three-phase electric transmission line system of claim 1 wherein said plurality of relay devices are programmed to monitor instantaneous undercurrent, and a second operating condition of said operating conditions being selected from the group consisting of a) line differential overcurrent; b) negative sequence instantaneous overcurrent; and to further monitor line instantaneous undercurrent in combination with neutral line differential overcurrent.

8. The method for preventing ground fault or other short circuit in a three-phase electric transmission line system of claim 1 wherein said plurality of relay devices are programmed to monitor instantaneous undercurrent, and a second operating condition of said operating conditions being selected from the group consisting of a) line differential overcurrent; b) negative sequence instantaneous overcurrent; and to further monitor changes in line instantaneous undercurrent in combination with zero sequence instantaneous overcurrent.

9. The method for preventing ground fault or other short circuit in a three-phase electric transmission line system of claim 1 wherein said plurality of relay devices are programmed to be highly sensitive so as to monitor and measure differential overcurrent in the range of 0.01 to 0.5 amp, and so as to monitor and measure instantaneous undercurrent in the range of 0.1 to 1 amp.

10. The method for preventing ground fault or other short circuit in a three-phase electric transmission line system of claim 1 wherein said plurality of relay devices are programmed to be highly sensitive so as to monitor and measure differential overcurrent in the range of 0.01 to 0.5 amp, and so as to monitor and measure instantaneous undercurrent in the range of 0.01 to 0.05 amp.

11. The method for preventing ground fault or other short circuit in a three-phase electric transmission line system of claim 1 wherein said plurality of relay devices are programmed to be highly sensitive so as to monitor and measure negative sequence instantaneous overcurrent in the range of 0.01 to 0.5 amp, and so as to monitor and measure instantaneous undercurrent in the range of 0.01 to 0.5 amp.

12. The method for preventing ground fault or other short circuit in a three-phase electric transmission line system of claim 1 wherein said relay protection system includes sufficient software and hardware for recognizing breakage capacitive current within 0.5 seconds when said at least one operating condition falls outside of said preset parameter ranges, and communicating to open the circuit breaker on said broken line within 10 milliseconds, thereby shutting down power to said broken line before it otherwise causes a ground fault or other short circuit.

13. The method for preventing ground fault or other short circuit in a three-phase electric transmission line system of claim 1 wherein said relay protection system includes a plurality of relay devices having phasors for monitoring all three phase voltages and currents and phase angle similarities and differences to detect capacitive current and deviations from preset ranges thereof.

14. The method for preventing ground fault or other short circuit in a three-phase electric transmission line system of claim 11 wherein there are at least two AND gates and at least one OR gate for processing monitored data readings and tripping breakers, including a first AND gate that receives line differential overcurrent readings and instantaneous undercurrent readings, and includes a second AND gate that receives negative sequence instantaneous overcurrent readings and second instantaneous undercurrent readings.

15. The method for preventing ground fault or other short circuit in a three-phase electric transmission line system of claim 1 wherein there are at least two AND gates and at least one OR gate for processing monitored data readings and tripping breakers, including a first and gate that receives line differential overcurrent readings and one of instantaneous undercurrent readings and negative sequence instantaneous overcurrent, and includes a second AND gate that receives zero sequence instantaneous overcurrent readings and instantaneous under current readings.

16. The method for preventing ground fault or other short circuit in a three-phase electric transmission line system of claim 1 wherein there are at least two AND gates and at least one OR gate for processing monitored data readings and tripping breakers, including a first AND gate that receives line differential overcurrent readings and one of instantaneous undercurrent readings and negative sequence instantaneous overcurrent, and includes a second AND gate that receives neutral line differential overcurrent readings and instantaneous undercurrent readings.

17. The method for preventing ground fault or other short circuit in a three-phase electric transmission line system of claim 1 wherein there are at least two AND gates and at least one OR gate for processing monitored data readings and tripping breakers, including a first AND gate that receives line differential overcurrent readings and one of instantaneous undercurrent readings and negative sequence instantaneous overcurrent, and includes a second AND gate that receives zero sequence instantaneous overcurrent readings and change in instantaneous undercurrent readings.

18. The method for preventing ground fault or other short circuit in a three-phase electric transmission line system of claim 1 wherein there are at least three AND gates and at least one OR gate for processing monitored data readings and tripping breakers, including a first AND gate that receives line instantaneous undercurrent readings and negative sequence overcurrent readings, and including a second AND gate that receives zero sequence overcurrent readings and instantaneous undercurrent readings, and including a third AND gate that receives neutral line differential overcurrent readings and instantaneous undercurrent readings.

19. The method for preventing ground fault or other short circuit in a three-phase electric transmission line system of claim 1 wherein there are at least three AND gates and at least one OR gate for processing monitored data readings and tripping breakers, including a first AND gate that receives line instantaneous undercurrent readings and negative sequence instantaneous overcurrent readings, and includes a second AND gate that receives neutral line differential overcurrent readings and instantaneous undercurrent readings and a third AND gate that receives zero sequence instantaneous overcurrent readings and change in instantaneous undercurrent readings.

20. The method for preventing ground fault or other short circuit in a three-phase electric transmission line system of claim 1 wherein there are at least five AND gates and at least one OR gate for processing monitored data readings and tripping breakers, including a first AND gate that receives line differential overcurrent readings and instantaneous undercurrent readings, and including a second AND gate that receives instantaneous undercurrent readings and negative sequence overcurrent readings, and includes a third AND gate that receives neutral line differential overcurrent readings and instantaneous undercurrent readings and a fourth AND gate that receives zero sequence instantaneous overcurrent readings and instantaneous undercurrent readings and a fifth AND gate that receives zero sequence instantaneous overcurrent readings and change in instantaneous undercurrent readings.

\* \* \* \* \*